(12) United States Patent
Hayashiguchi

(10) Patent No.: US 11,967,545 B2
(45) Date of Patent: Apr. 23, 2024

(54) SEMICONDUCTOR DEVICE

(71) Applicant: ROHM CO., LTD., Kyoto (JP)

(72) Inventor: Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 337 days.

(21) Appl. No.: 17/596,369

(22) PCT Filed: Jul. 6, 2020

(86) PCT No.: PCT/JP2020/026429
§ 371 (c)(1),
(2) Date: Dec. 8, 2021

(87) PCT Pub. No.: WO2021/010210
PCT Pub. Date: Jan. 21, 2021

(65) Prior Publication Data
US 2022/0254758 A1     Aug. 11, 2022

(30) Foreign Application Priority Data
Jul. 12, 2019    (JP) ................................. 2019-130299

(51) Int. Cl.
*H01L 23/498*     (2006.01)
*H01L 23/00*     (2006.01)
(Continued)

(52) U.S. Cl.
CPC .... *H01L 23/49811* (2013.01); *H01L 23/3735* (2013.01); *H01L 24/32* (2013.01);
(Continued)

(58) Field of Classification Search
CPC .......... H01L 23/49811; H01L 23/3735; H01L 24/32; H01L 24/40; H01L 24/48;
(Continued)

(56) References Cited

U.S. PATENT DOCUMENTS

2020/0035656 A1    1/2020   Miyazaki et al.

FOREIGN PATENT DOCUMENTS

| JP | 2000-324846 A | 11/2000 |
|---|---|---|
| JP | 2009-59890 A | 3/2009 |

(Continued)

OTHER PUBLICATIONS

International Search Report issued in PCT/JP2020/026429, dated Sep. 24, 2020 (2 pages).
(Continued)

*Primary Examiner* — Robert G Bachner
(74) *Attorney, Agent, or Firm* — HSML P.C.

(57) ABSTRACT

A semiconductor device includes a semiconductor element, a first terminal, a second terminal, a first conductor, a first connecting member, and a second connecting member. The semiconductor element includes a first electrode, a second electrode, and a third electrode, and is configured to perform on/off control between the first electrode and the second electrode based on a drive signal inputted to the third electrode. The first terminal and the second terminal are separated apart from each other and electrically connected to the first electrode. The first conductor is electrically connected to the first terminal. The first connecting member electrically connects the first electrode and the first conductor. The second connecting member electrically connects the first conductor and the second terminal.

18 Claims, 17 Drawing Sheets

(51) Int. Cl.
*H01L 23/373* (2006.01)
*H01L 25/07* (2006.01)
*H01L 25/18* (2023.01)

(52) U.S. Cl.
CPC .............. *H01L 24/40* (2013.01); *H01L 24/48* (2013.01); *H01L 24/73* (2013.01); *H01L 25/072* (2013.01); *H01L 25/18* (2013.01); *H01L 2224/32225* (2013.01); *H01L 2224/40225* (2013.01); *H01L 2224/48225* (2013.01); *H01L 2224/73221* (2013.01); *H01L 2224/73263* (2013.01); *H01L 2224/73265* (2013.01); *H01L 2924/10272* (2013.01); *H01L 2924/12032* (2013.01); *H01L 2924/13091* (2013.01); *H01L 2924/19107* (2013.01); *H01L 2924/30107* (2013.01)

(58) Field of Classification Search
CPC ....... H01L 24/73; H01L 25/072; H01L 25/18; H01L 2224/32225; H01L 2224/40225; H01L 2224/48225; H01L 2224/73221; H01L 2224/73263; H01L 2224/73265; H01L 2924/10272; H01L 2924/12032; H01L 2924/13091; H01L 2924/19107; H01L 2924/30107; H01L 24/06; H01L 24/45; H01L 2224/04034; H01L 2224/04042; H01L 23/3107; H01L 23/4334; H01L 23/49562; H01L 23/5386; H01L 23/62; H01L 24/49; H01L 23/49531; H01L 2224/06181; H01L 2224/32245; H01L 2224/40137; H01L 2224/45124; H01L 2224/45144; H01L 2224/45147; H01L 2224/48227; H01L 2224/48247; H01L 2224/48472; H01L 2224/49109; H01L 2224/49113; H01L 2224/4917; H01L 2924/00014; H01L 2924/181; H01L 2224/0603; H01L 2224/40139; H01L 2224/48137; H01L 2224/49111; H01L 2224/49175; H01L 23/481; H02M 1/08; H02M 7/003

See application file for complete search history.

(56) References Cited

FOREIGN PATENT DOCUMENTS

| | | |
|---|---|---|
| JP | 2013-169088 A | 8/2013 |
| JP | 2014-120563 A | 6/2014 |
| JP | 2017-5165 A | 1/2017 |
| JP | 2019-54665 A | 4/2019 |
| WO | 2018/186353 A1 | 10/2018 |

OTHER PUBLICATIONS

Office Action received in the corresponding Japanese Patent application, dated Dec. 19, 2023, and machine translation (6 pages).

SEMICONDUCTOR DEVICE

TECHNICAL FIELD

The present disclosure relates to a semiconductor device provided with a semiconductor element.

BACKGROUND ART

When an overcurrent (e.g., a short-circuit current) flows in a semiconductor element such as a metal oxide semiconductor field effect transistor (MOSFET) or an insulated gate bipolar transistor (IGBT), abnormal heat may be generated and break the semiconductor element. The time from the occurrence of a short circuit to an element breakage is referred to as a short-circuit tolerance. It is necessary to improve the short-circuit tolerance to suppress the element breakage. For example, Patent Document 1 discloses a semiconductor element having an improved short-circuit tolerance.

Furthermore, the semiconductor element may be covered with a resin package for protection from light, heat, humidity, and so on. For example, Patent Document 2 discloses a semiconductor device in which a semiconductor element is covered with a resin package. Such a structure still has room for improvement in the short-circuit tolerance of a semiconductor element.

PRIOR ART DOCUMENT

Patent Document

Patent Document 1: JP-A-2009-59890
Patent Document 2: JP-A-2017-5165

SUMMARY OF THE INVENTION

Technical Problem

In view of the foregoing circumstances, an object of the present disclosure is to provide a semiconductor device in which the short-circuit tolerance of a semiconductor element has been improved.

Solution to Problem

In accordance with the present disclosure, there is provided a semiconductor device comprising: a semiconductor element including a first electrode, a second electrode, and a third electrode, where the semiconductor element is configured to perform on/off control between the first electrode and the second electrode based on a drive signal inputted to the third electrode; a first terminal and a second terminal that are separated apart from each other and electrically connected to the first electrode; a first conductor electrically connected to the first terminal; a first connecting member electrically connecting the first electrode and the first conductor; and a second connecting member electrically connecting the first conductor and the second terminal.

Advantages of Invention

The semiconductor device of the present disclosure can improve the short-circuit tolerance of the semiconductor element.

MODE FOR CARRYING OUT THE INVENTION

Figure 1:
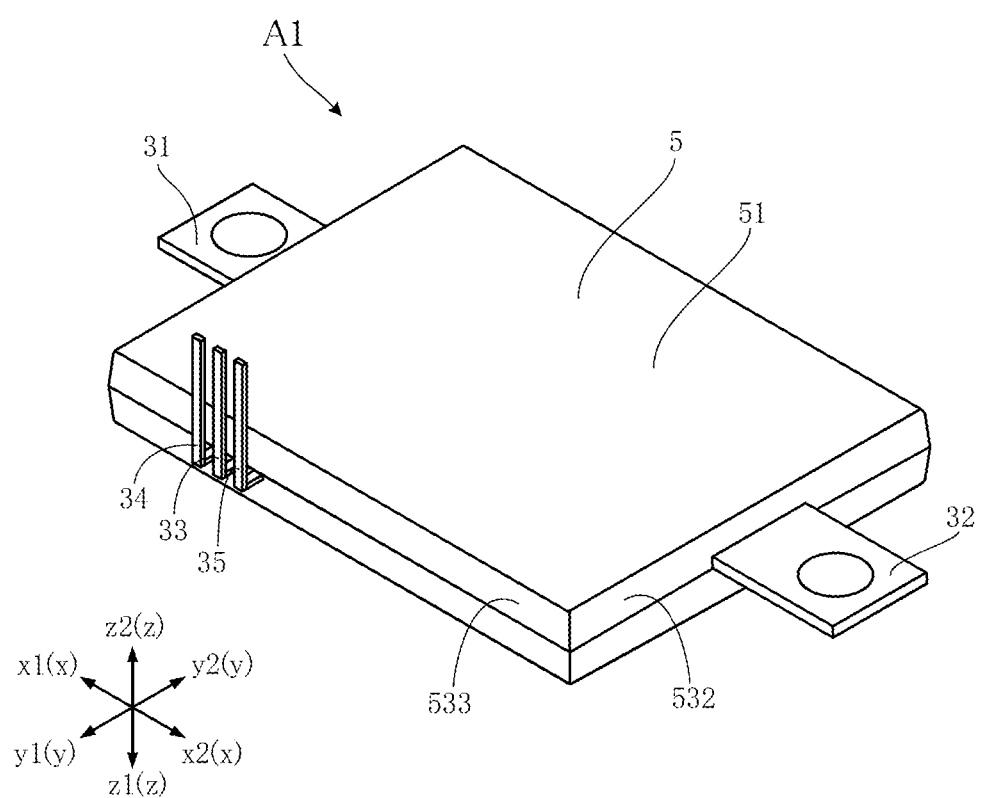
FIG. 1 is a perspective view showing a semiconductor device according to a first embodiment.

The following describes a semiconductor device according to the present disclosure with reference to the drawings. The structural elements that are identical or similar to each other are provided with the same reference signs and the descriptions thereof are omitted.

FIGS. 1 to 6 show a semiconductor device according to a first embodiment of the present disclosure. A semiconductor device A1 shown in these figures includes a plurality of semiconductor elements 11, a plurality of semiconductor elements 12, a supporting member 2, two power terminals 31 and 32, a signal terminal 33, two detection terminals 34 and 35, a plurality of connecting members 41 to 45, and a resin member 5.

Figure 2:
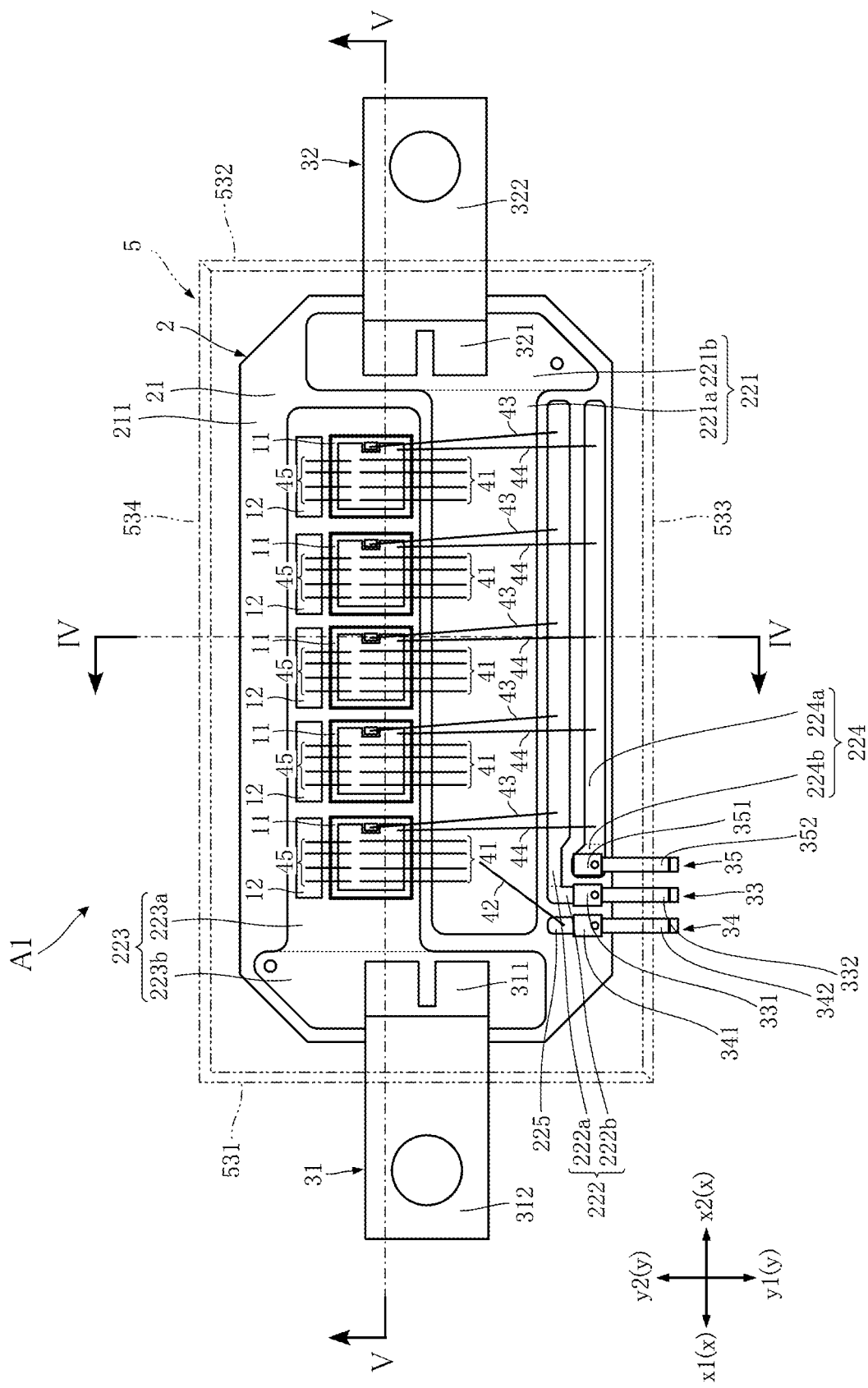
FIG. 2 is a plan view showing the semiconductor device according to the first embodiment.
Figure 3:
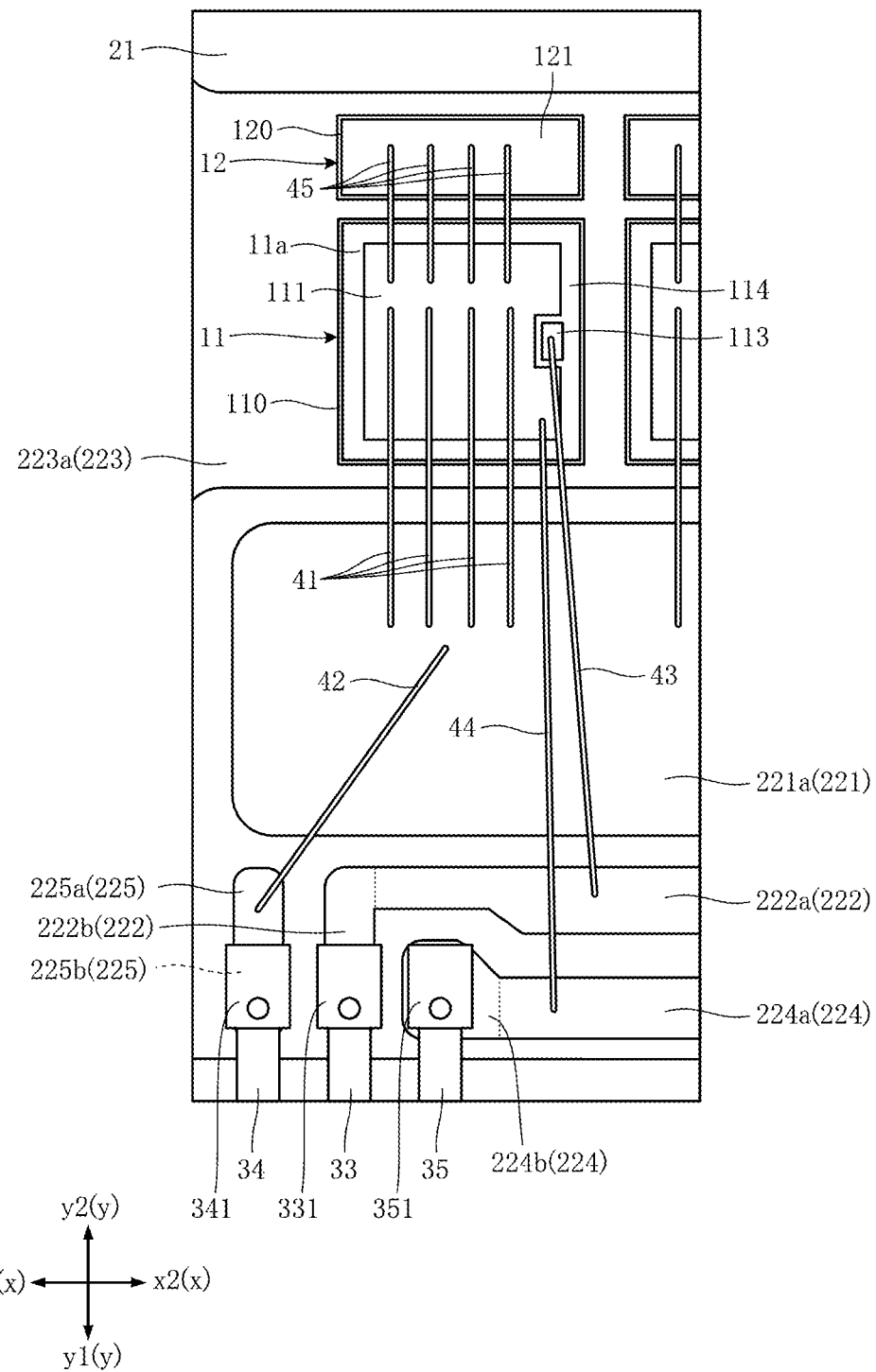
FIG. 3 is a partially enlarged view showing a part of FIG. 2.
Figure 4:
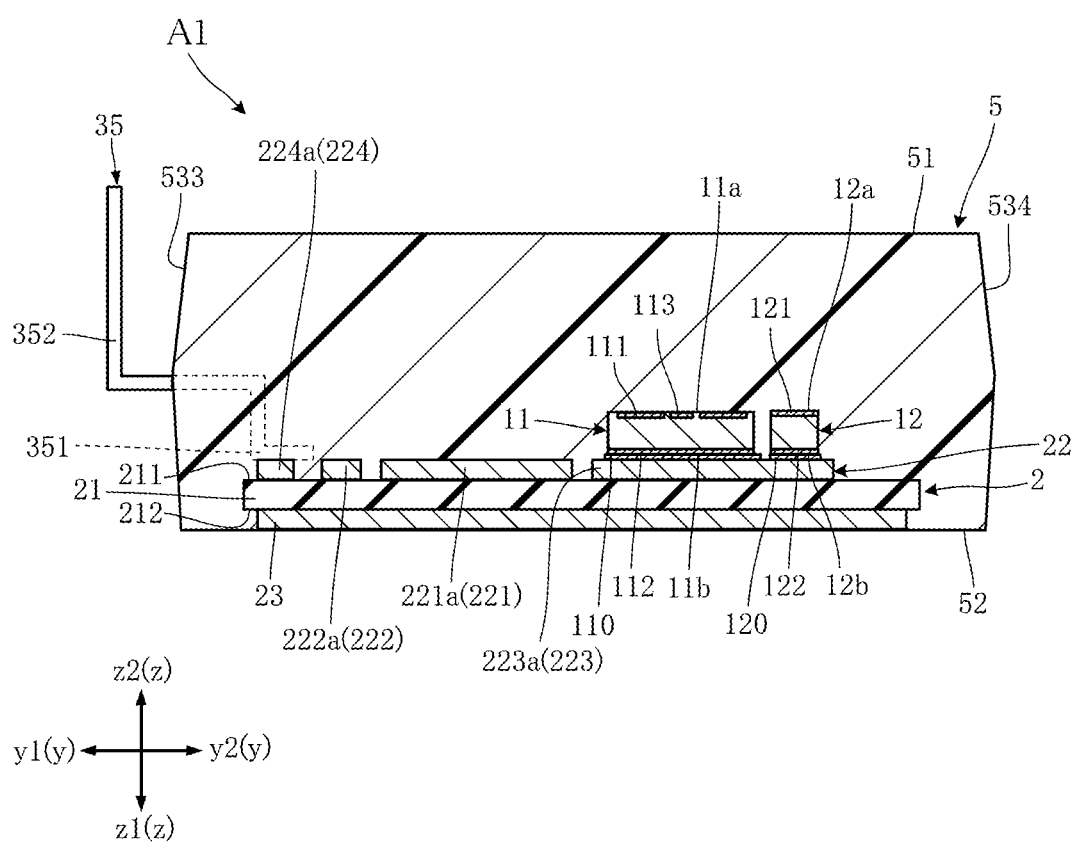
FIG. 4 is a cross-sectional view along line IV-IV in FIG. 2.
Figure 5:
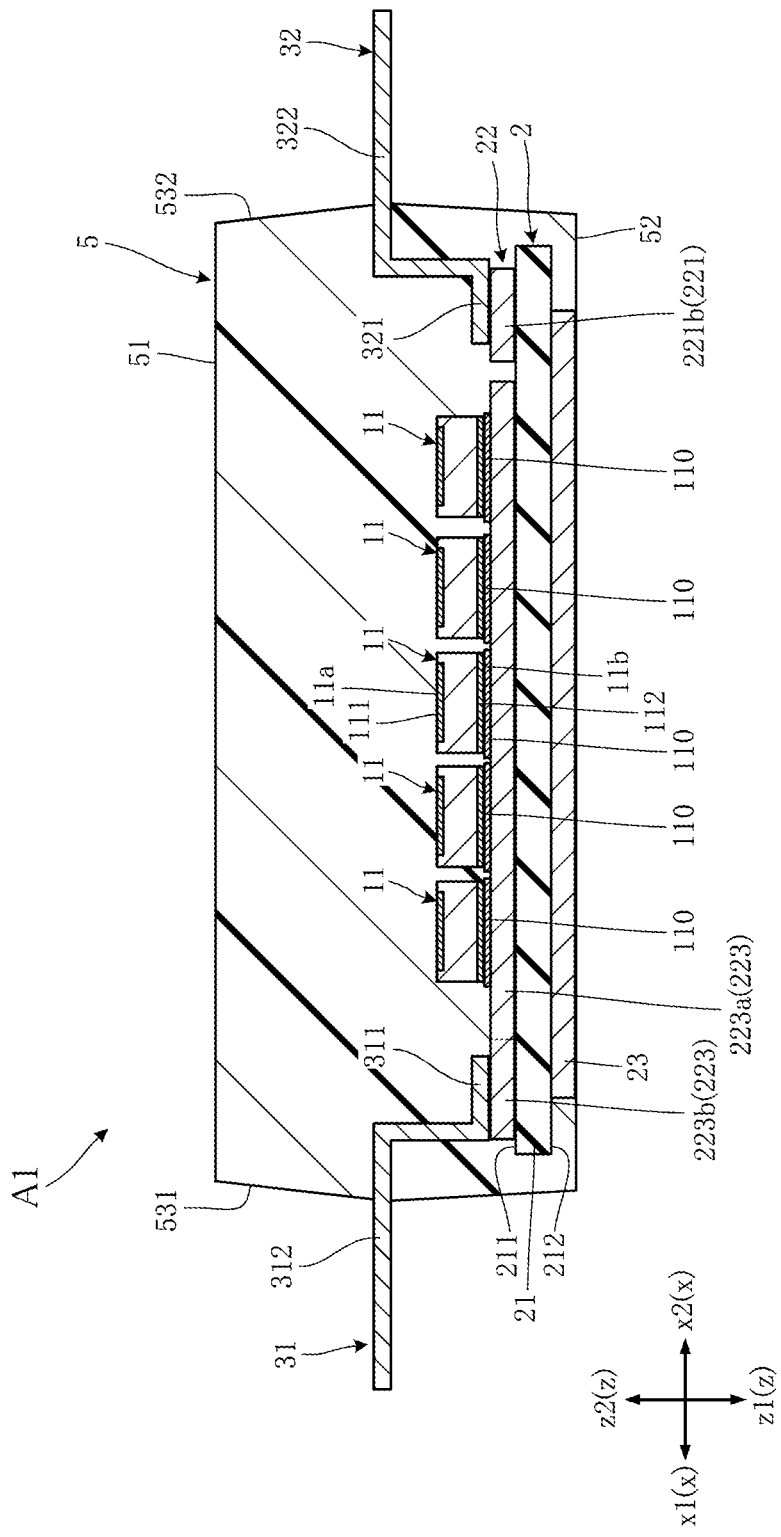
FIG. 5 is a cross-sectional view along line V-V in FIG. 2.
Figure 6:
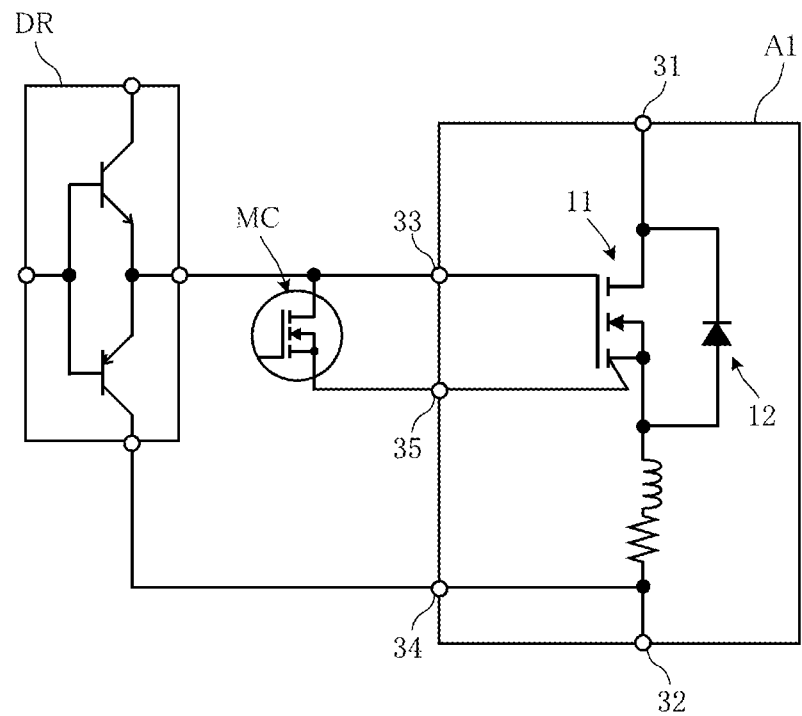
FIG. 6 is a circuit diagram showing the semiconductor device according to the first embodiment.

FIG. 1 is a perspective view showing the semiconductor device A1. FIG. 2 is a plan view showing the semiconductor device A1, and shows the resin member 5 with an imaginary line (two-dot chain line). FIG. 3 is a partially enlarged view showing a part of FIG. 2. FIG. 4 is a cross-sectional view along line IV-IV in FIG. 2. FIG. 5 is a cross-sectional view along line V-V in FIG. 2. In FIGS. 4 to 5, the plurality of connecting members 41 to 45 are omitted. FIG. 6 is a circuit diagram for explaining the circuit configuration of the semiconductor device A1. The circuit diagram of FIG. 6 shows one semiconductor element 11 and one semiconductor element 12 for simplicity.

In FIGS. 1 to 5, three directions that are perpendicular to each other are referred to as x direction, y direction, and z direction, respectively. The z direction corresponds to the thickness direction of the semiconductor device A1. When necessary, one sense of the x direction is referred to as x1 direction, and the other as an x2 direction for distinction. The same applies to the y direction and the z direction.

The plurality of semiconductor elements 11 play the central function of the semiconductor device A1. As viewed in the z direction (hereinafter, also referred to as "plan view"), each of the semiconductor elements 11 has a rectangular shape, for example. The semiconductor elements 11 are configured with a semiconductor material that mainly contains silicon carbide (SiC), for example. The semiconductor material is not limited to SiC, and may be silicon (Si), gallium arsenide (GaAs), or gallium nitride (GaN). The semiconductor elements 11 are metal-oxide-semiconductor field-effect transistors (MOSFETs), for example. The semiconductor elements 11 are not limited to MOSFETs, and may be field effect transistors such as metal-insulator-semiconductor FETs (MISFETs) or bipolar transistors such as insulated gate bipolar transistors (IGBTs). In the illustrated example, the plurality of semiconductor elements 11 are, for example, n-channel MOSFETs and identical to each other. The semiconductor elements 11 may be p-channel type MOSFETs.

As shown in FIGS. 2 and 5, the plurality of semiconductor elements 11 are connected in parallel to each other. Although five semiconductor elements 11 are provided in the example shown in FIG. 2, the number of the semiconductor elements 11 can be freely selected according to the performance required for the semiconductor device A1. Each of the semiconductor elements 11 is bonded to the supporting member 2 with a conductive bonding member 110. The conductive bonding member 110 is solder, silver paste or sintered metal, for example.

Each of the semiconductor elements 11 has an element obverse surface 11a and an element reverse surface 11b. The element obverse surface 11a and the element reverse surface 11b of each semiconductor element 11 are separated apart from each other in the z direction. The element obverse surface 11a is the upper surface of the semiconductor element 11, and faces in the z2 direction. The element reverse surface 11b is the lower surface of the semiconductor element 11, and faces in the z1 direction. The element reverse surface 11b faces the supporting member 2.

Each of the semiconductor elements 11 has a first electrode 111, a second electrode 112, a third electrode 113, and an insulating film 114.

The first electrode 111 and the third electrode 113 are arranged on the element obverse surface 11a. The first electrode 111 is larger than the third electrode 113 in plan view. The second electrode 112 is arranged on the element reverse surface 11b. The second electrode 112 is provided over the entirety (or substantially the entirety) of the element reverse surface 11b. In each of the semiconductor elements 11, which are MOSFETs, the first electrode 111 is a source electrode, the second electrode 112 is a drain electrode, and the third electrode 113 is a gate electrode. The second electrode 112 is electrically connected to a part of the supporting member 2 (a conductor layer 223 of an obverse-surface metal layer 22 described below) via the conductive bonding member 110. The second electrode 112 is in contact with the conductive bonding member 110.

The insulating film 114 is arranged on the element obverse surface 11a. The insulating film 114 is electrically insulative. The insulating film 114 is formed between the first electrode 111 and the third electrode 113 to insulate these electrodes from each other. The first electrode 111 may be divided into a plurality of regions. In this case, the insulating film 114 is also formed between these regions to insulate them from each other. For example, the insulating film 114 is formed by stacking a silicon dioxide ($SiO_2$) layer, a silicon nitride ($SiN_4$) layer, and a polybenzoxazole layer in the stated order on the element obverse surface 11a. It is possible to use a polyimide layer instead of the polybenzoxazole layer.

The plurality of semiconductor elements 12 are diodes such as Schottky-barrier diodes. As shown in FIG. 6, the semiconductor elements 12 are connected in reverse parallel to the semiconductor elements 11.

Each of the semiconductor elements 12 is bonded to the supporting member 2 with a conductive bonding member 120. The conductive bonding member 120 is solder, silver paste or sintered metal, for example. In the illustrated example, the number of semiconductor elements 12 corresponds to the number of semiconductor elements 11. In another example, the semiconductor device A1 may not include the semiconductor elements 12.

Each of the semiconductor elements 12 has an element obverse surface 12a and an element reverse surface 12b. The element obverse surface 12a and the element reverse surface 12b of each semiconductor element 12 are separated apart from each other in the z direction. The element obverse surface 12a is the upper surface of the semiconductor element 12, and faces in the z2 direction. The element reverse surface 12b is the lower surface of the semiconductor element 12, and faces in the z1 direction. The element reverse surface 12b faces the supporting member 2.

Each of the semiconductor elements 12 has an anode electrode 121 and a cathode electrode 122. The anode electrode 121 is arranged on the element obverse surface 12a. The cathode electrode 122 is arranged on the element reverse surface 12b. The cathode electrode 122 is electrically connected to a part of the supporting member 2 (the conductor layer 223 of the obverse-surface metal layer 22 described below) via the conductive bonding member 120.

The supporting member 2 supports the plurality of semiconductor elements 11 and 12, and serves as a conduction path between the semiconductor elements 11 and a plurality of terminals (the power terminals 31 and 32, the signal terminal 33, and the detection terminals 34 and 35). The supporting member 2 includes an insulating substrate 21, an obverse-surface metal layer 22, and a reverse-surface metal layer 23.

The insulating substrate 21 is electrically insulative. The insulating substrate 21 may be made of a ceramic material having a high thermal conductivity. Examples of such a ceramic material include aluminum nitride (AlN), silicon nitride (SiN), and aluminum oxide ($Al_2O_3$). The insulating substrate 21 has a flat plate-like shape, for example.

The insulating substrate 21 has an obverse surface 211 and a reverse surface 212. The obverse surface 211 and the reverse surface 212 are separated apart from each other in the z direction. The obverse surface 211 faces in the z2 direction, and the reverse surface 212 faces in the z1 direction.

The obverse-surface metal layer 22 is formed on the obverse surface 211 of the insulating substrate 21. The obverse-surface metal layer 22 is made of copper, for example, but may be made of another material such as aluminum. The obverse-surface metal layer 22 is covered with the resin member 5. The obverse-surface metal layer 22 includes a plurality of conductor layers 221 to 225. The plurality of conductor layers 221 to 225 are separated apart from each other.

The conductor layer 221 includes a band-shaped portion 221a and a terminal bonding portion 221b. The band-shaped portion 221a extends in the x direction, and the plurality of connecting members 41 and the connecting member 42 are bonded to the band-shaped portion 221*a*. The terminal bonding portion 221*b* is where a part of the power terminal 32 (a pad portion 321 described below) is bonded. The band-shaped portion 221*a* and the terminal bonding portion 221*b* are connected to and integrally formed with each other.

The conductor layer 222 includes a band-shaped portion 222*a* and a terminal bonding portion 222*b*. The band-shaped portion 222*a* extends in the x direction, and the plurality of connecting members 43 are bonded to the band-shaped portion 222*a*. The terminal bonding portion 222*b* is where a part of the signal terminal 33 (a pad portion 331 described below) is bonded. The band-shaped portion 222*a* and the terminal bonding portion 222*b* are connected to and integrally formed with each other.

The conductor layer 223 includes a band-shaped portion 223*a* and a terminal bonding portion 223*b*. The band-shaped portion 223*a* extends in the x direction, and the plurality of semiconductor elements 11 and 12 are bonded to the band-shaped portion 223*a*. The plurality of semiconductor elements 11 bonded to the band-shaped portion 223*a* are aligned in the direction (x direction) in which the band-shaped portion 223*a* extends. The terminal bonding portion 223*b* is where a part of the power terminal 31 (a pad portion 311 described below) is bonded. The band-shaped portion 223*a* and the terminal bonding portion 223*b* are connected to and integrally formed with each other. The conductor layer 223 is electrically connected to the second electrodes 112 (drain electrodes) of the semiconductor elements 11 via the conductive bonding members 110, and is electrically connected to the cathode electrodes 122 of the semiconductor elements 12 via the conductive bonding members 120. In other words, the second electrodes 112 of the semiconductor elements 11 and the cathode electrodes 122 of the semiconductor elements 12 are electrically connected to each other via the conductor layer 223.

The conductor layer 224 includes a band-shaped portion 224*a* and a terminal bonding portion 224*b*. The band-shaped portion 224*a* extends in the x direction, and the plurality of connecting members 44 are bonded to the band-shaped portion 224*a*. The terminal bonding portion 224*b* is where a part of the detection terminal 35 (a pad portion 351 described below) is bonded. The band-shaped portion 224*a* and the terminal bonding portion 224*b* are connected to and integrally formed with each other.

The conductor layer 225 includes a connecting-member bonding portion 225*a* and a terminal bonding portion 225*b*. The connecting-member bonding portion 225*a* is where the connecting member 42 is bonded. The terminal bonding portion 225*b* is where a part of the detection terminal 34 (a pad portion 341 described below) is bonded. The connecting-member bonding portion 225*a* and the terminal bonding portion 225*b* are connected to and integrally formed with each other.

The band-shaped portions 221*a*, 222*a*, 223*a*, and 224*a* of the obverse-surface metal layer 22 are aligned in the y direction, and overlap with each other as viewed in the y direction. The alignment order of the plurality of band-shaped portions 221*a*, 222*a*, 223*a*, and 224*a* in the y direction is not particularly limited. In the example shown in FIG. 2, the band-shaped portions 221*a*, 222*a*, 223*a*, and 224*a* are aligned in order of the band-shaped portion 224*a*, the band-shaped portion 222*a*, the band-shaped portion 221*a*, and the band-shaped portion 223*a* from the y1 side to the y2 side. The band-shaped portion 221*a* is arranged between the band-shaped portion 222*a* and the band-shaped portion 223*a* in the y direction, and the band-shaped portion 222*a* is arranged between the band-shaped portion 221*a* and the band-shaped portion 224*a* in the y direction. The band-shaped portion 223*a* is arranged opposite to the band-shaped portion 222*a* in the y direction with the band-shaped portion 221*a* therebetween.

The reverse-surface metal layer 23 is formed on the reverse surface 212 of the insulating substrate 21. The reverse-surface metal layer 23 is made of the same material as the obverse-surface metal layer 22. The surface of the reverse-surface metal layer 23 that faces in the z1 direction is exposed from the resin member 5. Note that the surface facing in the z1 direction may be covered with the resin member 5. The supporting member 2 may not include the reverse-surface metal layer 23. In this case, the reverse surface 212 of the insulating substrate 21 may be covered with the resin member 5 or may be exposed from the resin member 5.

The power terminals 31 and 32, the signal terminal 33, and the detection terminals 34 and 35 are partially exposed from the resin member 5. The power terminals 31 and 32, the signal terminal 33, and the detection terminals 34 and 35 are bonded to the obverse-surface metal layer 22 within the resin member 5. The constituent material of each of the power terminals 31 and 32, the signal terminal 33, and the detection terminals 34 and 35 is copper or a copper alloy, for example. The power terminals 31 and 32, the signal terminal 33, and the detection terminals 34 and 35 are formed from the same lead frame, for example.

The power terminal 31 is a drain terminal in the semiconductor device A1. The power terminal 31 is a plate-like member. The power terminal 31 is electrically connected to the second electrodes 112 (drain electrodes) of the semiconductor elements 11 via the conductor layer 223 and the conductive bonding members 110.

The power terminal 31 includes a pad portion 311 and a terminal portion 312. The pad portion 311 is covered with the resin member 5. The pad portion 311 is bonded to the conductor layer 223. The bonding may be performed by any method selected from bonding with a conductive bonding material (e.g., solder or sintered metal), laser bonding, or ultrasonic bonding. The terminal portion 312 is exposed from the resin member 5. As shown in FIG. 2, the terminal portion 312 extends from the resin member 5 in the x1 direction in plan view. The surface of the terminal portion 312 may be plated with silver, for example.

The power terminal 32 is a source terminal in the semiconductor device A1. The power terminal 32 is a plate-like member. The power terminal 32 is electrically connected to the first electrodes 111 (source electrodes) of the semiconductor elements 11 via the conductor layer 221 and the plurality of connecting members 41.

The power terminal 32 includes a pad portion 321 and a terminal portion 322. The pad portion 321 is covered with the resin member 5. The pad portion 321 is bonded to the conductor layer 221. The bonding may be performed by any method selected from bonding with a conductive bonding material (e.g., solder or sintered metal), laser bonding, or ultrasonic bonding. The terminal portion 322 is exposed from the resin member 5. As shown in FIG. 2, the terminal portion 322 extends from the resin member 5 in the x2 direction in plan view. The surface of the terminal portion 322 may be plated with silver, for example.

The signal terminal 33 is a gate terminal in the semiconductor device A1. The signal terminal 33 is electrically connected to the third electrodes 113 (gate electrodes) of the semiconductor elements 11 via the conductor layer 222 and the plurality of connecting members 43. A drive signal for the on/off control of each semiconductor element 11 is inputted to the signal terminal 33. As shown in FIG. 6, the signal terminal 33 is connected to a drive circuit DR, for example, that inputs a drive signal. The drive circuit DR shown in FIG. 6 is merely an example, and the present disclosure is not limited to this.

The signal terminal 33 includes a pad portion 331 and a terminal portion 332. The pad portion 331 is covered with the resin member 5. The pad portion 331 is bonded to the conductor layer 222. The bonding may be performed by any method selected from bonding with a conductive bonding material (e.g., solder or sintered metal), laser bonding, or ultrasonic bonding. The terminal portion 332 is exposed from the resin member 5. The terminal portion 332 has an L shape as viewed in the x direction.

The detection terminal 34 is a source sense terminal in the semiconductor device A1. The detection terminal 34 is electrically connected to the first electrodes 111 (source electrodes) of the semiconductor elements 11 via the conductor layer 225, the connecting member 42, the conductor layer 221, and the plurality of connecting members 41. The detection terminal 34 is connected to the drive circuit DR, for example. The drive circuit DR generates a drive signal that controls the switching operation of each semiconductor element 11. The voltage applied to the detection terminal 34 is inputted to the drive circuit DR as a feedback signal.

The detection terminal 34 includes a pad portion 341 and a terminal portion 342. The pad portion 341 is covered with the resin member 5. The pad portion 341 is bonded to the conductor layer 225. The bonding may be performed by any method selected from bonding with a conductive bonding material (e.g., solder or sintered metal), laser bonding, or ultrasonic bonding. The terminal portion 342 is exposed from the resin member 5. The terminal portion 342 has an L shape as viewed in the x direction.

The detection terminal 35 is a source sense terminal in the semiconductor device A1. The detection terminal 35 is electrically connected to the first electrodes 111 (source electrodes) of the semiconductor elements 11 via the conductor layer 224 and the plurality of connecting members 44. As shown in FIG. 6, the detection terminal 35 is connected to a Miller clamp circuit MC external to the semiconductor device A1, for example. As shown in FIG. 6, the Miller clamp circuit MC can be connected between the detection terminal 35 and the signal terminal 33. The Miller clamp circuit MC is provided to prevent a malfunction (false gate turn-on) of each of the semiconductor elements 11 and includes a MOSFET, for example, as shown in FIG. 6. The source terminal of the MOSFET is connected to the detection terminal 35, and the drain terminal of the MOSFET is connected to the signal terminal 33. When the semiconductor elements 11 are turned off, the MOSFET of the Miller clamp circuit MC can be turned on, so that the gate-source voltage of the semiconductor elements 11 is forced to be approximately 0 (zero) V or a negative bias voltage and the rise of the gate potential of the semiconductor elements 11 is thereby prevented.

The detection terminal 35 includes a pad portion 351 and a terminal portion 352. The pad portion 351 is covered with the resin member 5. The pad portion 351 is bonded to the conductor layer 224. The bonding may be performed by any method selected from bonding with a conductive bonding material (e.g., solder or sintered metal), laser bonding, or ultrasonic bonding. The terminal portion 352 is exposed from the resin member 5. The terminal portion 352 has an L shape as viewed in the x direction.

The signal terminal 33, the detection terminal 34, and the detection terminal 35 are aligned in the x direction as shown in FIG. 2, and overlap with each other as viewed in the x direction as shown in FIG. 4. As shown in FIG. 2, the signal terminal 33 is arranged between the detection terminal 34 and the detection terminal 35 in the x direction. The signal terminal 33, the detection terminal 34, and the detection terminal 35 protrude from a resin side surface 533 on the y1 side.

Each of the connecting members 41 to 45 establishes electrical connection between two separate portions. The connecting members 41 to 45 are bonding wires, for example. The connecting members 41 to 45 are made of any of aluminum, gold, or copper, for example. Alternatively, the connecting members 41 to 45 may be made of an alloy containing any of the above metals.

Each of the connecting members 41 is bonded to the first electrode 111 (source electrode) of a different semiconductor element 11 at one end, and is bonded to the conductor layer 221 at the other end. The connecting members 41 electrically connect the first electrodes 111 and the conductor layer 221.

The connecting member 42 is bonded to the conductor layer 221 at one end (first end), and is bonded to the conductor layer 225 at the other end (second end). The connecting member 42 electrically connects the conductor layer 221 and the conductor layer 225. Preferably, the parasitic inductance from the first electrodes 111 of the semiconductor elements 11 to the bonding portion at which the connecting member 42 is bonded to the conductor layer 221 is no less than 0.3 nH and no greater than 2 nH, for example. In other words, it is preferable that the connecting member 42 be connected to a portion of the conductor layer 221 at which the parasitic inductance from the first electrodes 111 is no less than 0.3 nH and no greater than 2 nH. The second end of the connecting member 42 may be bonded to the pad portion 341 of the detection terminal 34 instead of being bonded to the conductor layer 225.

Each of the connecting members 43 is bonded to the third electrode 113 (gate electrode) of a different semiconductor element 11 at one end, and is bonded to the conductor layer 222 at the other end. The connecting members 43 electrically connect the third electrodes 113 and the conductor layer 222.

Each of the connecting members 44 is bonded to the first electrode 111 (source electrode) of a different semiconductor element 11 at one end, and is bonded to the conductor layer 224 at the other end. The connecting members 44 electrically connect the first electrodes 111 and the conductor layer 224. The connecting members 44 are sense lines connected to the first electrodes 111 (source electrodes) of the semiconductor elements 11 by Kelvin connection.

Each of the connecting members 45 is bonded to the first electrode 111 (source electrode) of a different semiconductor element 11 at one end, and is bonded to the anode electrode 121 of a different semiconductor element 12 at the other end. The connecting members 45 electrically connect the first electrodes 111 and the anode electrodes 121.

The resin member 5 is made of an electrically insulative material. The resin member 5 is made of an epoxy resin, for example. The resin member 5 covers the plurality of semiconductor elements 11, the plurality of semiconductor elements 12, and the plurality of connecting members 41 to 45. The resin member 5 also covers parts of the power terminals 31 and 32, the signal terminal 33, and the detection terminals 34 and 35. In the illustrated example, the resin member 5 has a resin obverse surface 51, a resin reverse surface 52, and a plurality of resin side surfaces 531 to 534. The shape of the resin member 5 shown in the figures is merely an example, and the present disclosure is not limited to this.

The resin obverse surface 51 and the resin reverse surface 52 are separated apart from each other in the z direction. The resin obverse surface 51 is the upper surface of the resin member 5 and faces in the z2 direction. The resin reverse surface 52 is the lower surface of the resin member 5, and faces in the z1 direction. As can be understood from FIGS. 4 and 5, the resin reverse surface 52 has a frame shape surrounding the reverse surface 212 of the insulating substrate 21, as viewed in the z direction. Each of the resin side surfaces 531 to 534 is connected to and sandwiched by the resin obverse surface 51 and the resin reverse surface 52. As shown in FIG. 2, the resin side surfaces 531 and 532 are separated apart from each other in the x direction. The resin side surface 531 faces in the x1 direction, and the resin side surface 532 faces in the x2 direction. The resin side surfaces 533 and 534 are separated apart from each other in the y direction. The resin side surface 533 faces in the y1 direction, and the resin side surface 534 faces in the y2 direction.

The semiconductor device A1 configured as described above has the following advantages.

The semiconductor device A1 includes the semiconductor elements 11, the conductor layer 221, the power terminal 32, the detection terminal 34, the connecting members 41, and the connecting member 42. Each of the semiconductor elements 11 includes the first electrode 111 (source electrode), the second electrode 112 (drain electrode), and the third electrode 113 (gate electrode), where the on/off control between the first electrode 111 and the second electrode 112 is performed by a drive signal inputted to the third electrode 113. The power terminal 32 and the detection terminal 34 are both electrically connected to the first electrodes 111. The power terminal 32 is a source terminal, and the detection terminal 34 is a source sense terminal. The first electrodes 111 and the conductor layer 221 are electrically connected to each other by the connecting members 41, and the conductor layer 221 and the detection terminal 34 are electrically connected to each other by the connecting member 42. According to the configuration, the connecting members 41, the conductor layer 221, and so on are disposed in the conduction path between the detection terminal 34 (source sense terminal) and the first electrodes 111 (source electrodes). As such, when an overcurrent flows between the second electrodes 112 and the first electrodes 111 (between drains and sources), the voltage applied between the third electrodes 113 and the first electrodes 111 (between gates and sources) can be reduced by the parasitic inductance at the connecting members 41 and the conductor layer 221, as compared to the case where the detection terminal 34 and the first electrodes 111 are directly connected to each other by bonding wires or the like. Hence, the semiconductor device A1 can improve the short-circuit tolerance of the semiconductor elements 11. In particular, since the parasitic inductance is used, the short-circuit tolerance of the semiconductor elements 11 can be improved without the use of any inductance elements or the like.

As described above, the semiconductor device A1 is such that the parasitic inductance is intentionally present in the conduction path between the first electrodes 111 of the semiconductor elements 11 and the detection terminal 34. As a result, when the semiconductor elements 11 rise from an off state to an on state and when the semiconductor elements 11 fall from an on state to an off state, a sudden change in the voltage (gate voltage) applied to the third electrode 113, which is caused by a change in the current flowing in the second electrode 112 (change in the drain current: di/dt), can be suppressed. As such, the semiconductor device A1 can suppress the surge voltage of the semiconductor elements 11. One well-known method for suppressing the surge voltage is to slow down a change in the drive signal inputted to the semiconductor elements 11, for example. In the semiconductor device A1, however, the parasitic inductance as described above is used to suppress the surge voltage. In other words, the semiconductor device A1 can suppress the surge voltage of the semiconductor elements 11 without slowing down a change in the drive signal.

The semiconductor device A1 includes the detection terminal 34 and the detection terminal 35. Each of the detection terminals 34 and 35 is electrically connected to the first electrodes 111 of the semiconductor elements 11. The voltage of the first electrodes 111 is applied to the detection terminal 35, and the voltage after a voltage drop in the first electrode 111 due to the parasitic inductance at the connecting members 41 and the conductor layer 221 is applied to the detection terminal 34. According to this configuration, the semiconductor device A1 includes two types of source sense terminals, where the detection terminal 34 is configured as a source sense terminal that improves the short-circuit tolerance of the semiconductor elements 11, and the detection terminal 35 is configured as a source sense terminal suitable for connecting the Miller clamp circuit, for example. Thus, the semiconductor device A1 can improve the short-circuit tolerance of the semiconductor elements 11 while suppressing a false gate turn-on with the Miller clamp circuit.

Although the signal terminal 33 is bonded to the conductor layer 222 in the first embodiment, the present disclosure is not limited to this. For example, the signal terminal 33 may be separated apart from the conductor layer 222, and the signal terminal 33 and the conductor layer 222 may be connected via a bonding wire. Similarly, the detection terminal 34 may be separated apart from the conductor layer 225, and the detection terminal 34 and the conductor layer 225 may be connected via a bonding wire. Furthermore, the detection terminal 35 may be separated apart from the conductor layer 224, and the detection terminal 35 and the conductor layer 224 may be connected via a bonding wire.

Figure 7:
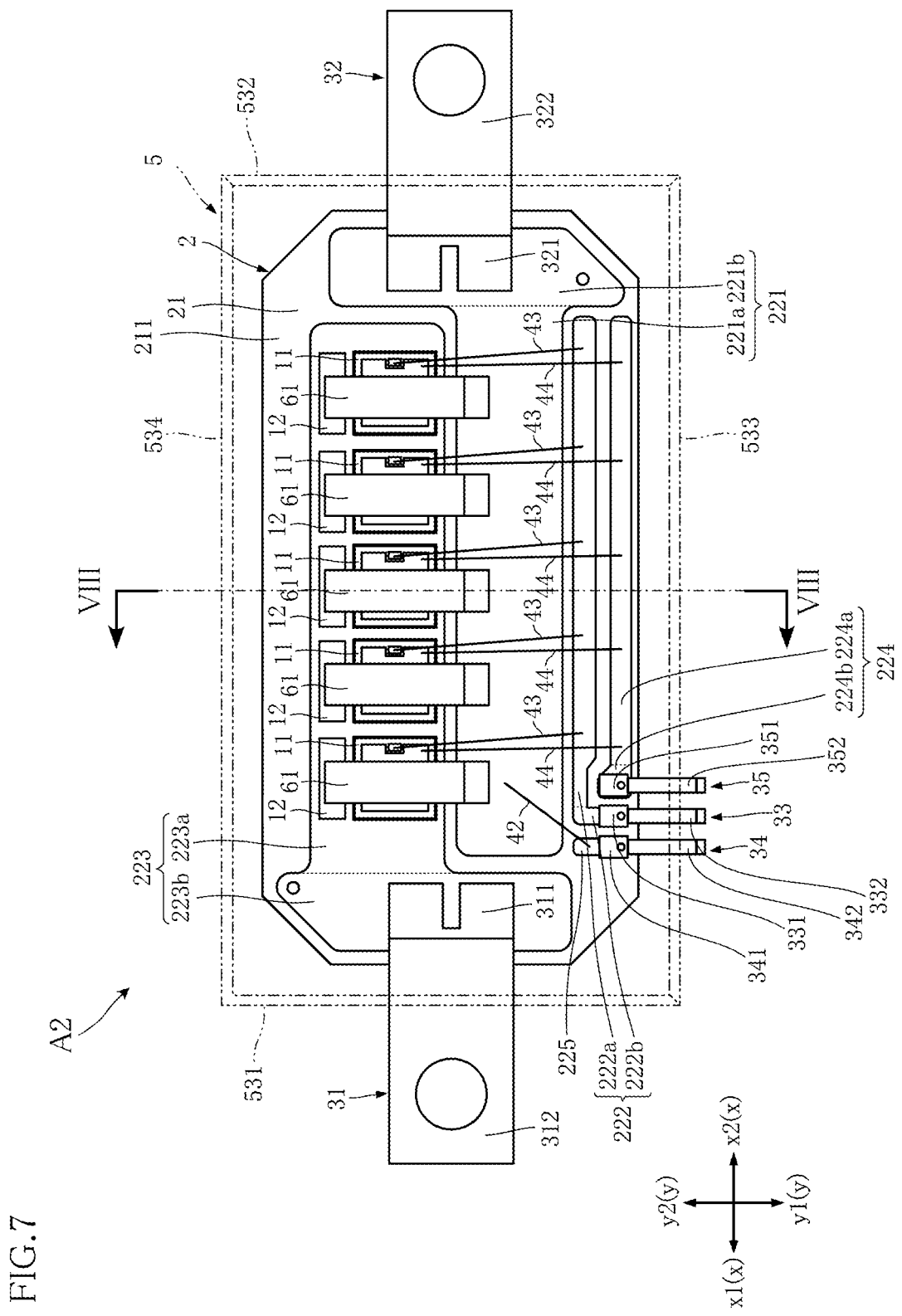
FIG. 7 is a plan view showing a semiconductor device according to a second embodiment.
Figure 8:
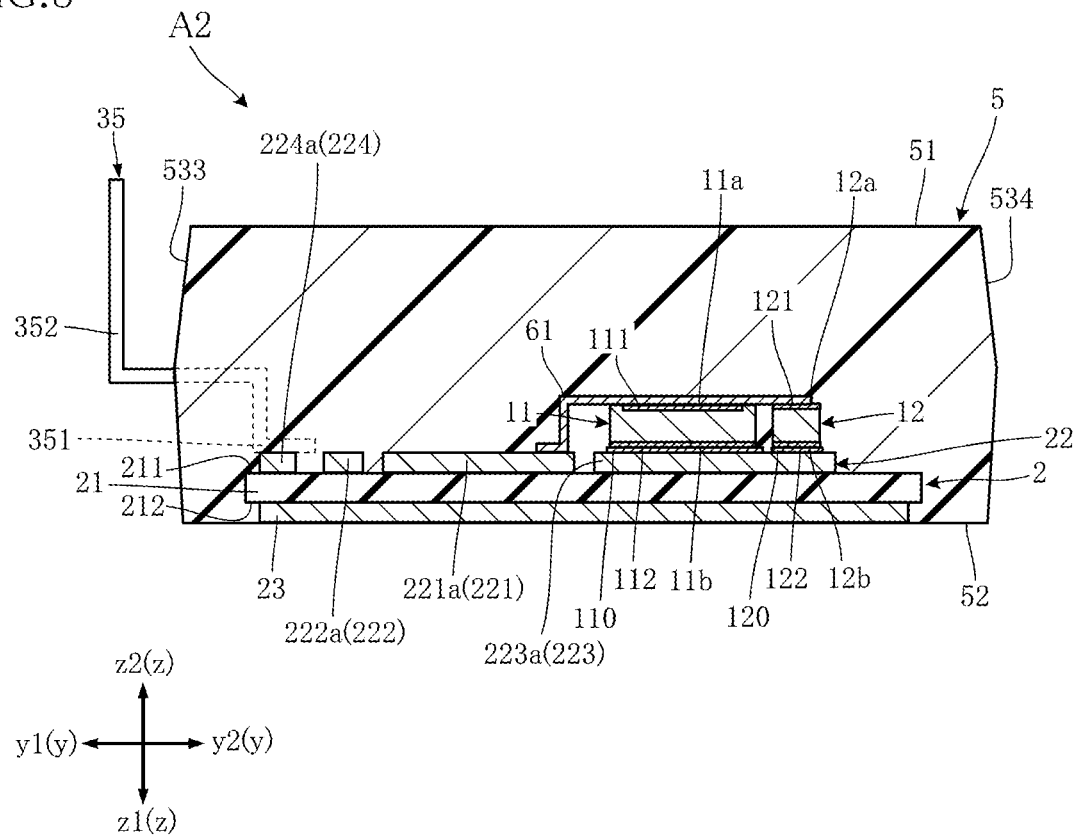
FIG. 8 is a cross-sectional view along line VIII-VIII in FIG. 7.

FIGS. 7 and 8 show a semiconductor device according to a second embodiment. A semiconductor device A2 according to the second embodiment is different from the semiconductor device A1 in including a plurality of connecting members 61 instead of the plurality of connecting members 41 and the plurality of connecting members 45. FIG. 7 is a plan view showing the semiconductor device A2, and shows the resin member 5 with an imaginary line. FIG. 8 is a cross-sectional view taken along line VIII-VIII in FIG. 7.

The plurality of connecting members 61 are conductive plate-like members. As with the connecting members 41 to 45, each of the connecting members 61 establishes electrical connection between two separate portions. The connecting members 61 are made of a metal such as copper, gold, or aluminum, for example. Each of the connecting members 61 can be formed by bending a band-shaped metal plate. Each of the connecting members 61 is bonded to the conductor layer 221, the first electrode 111 of a different semiconductor element 11, and the anode electrode 121 of a different semiconductor element 12 to electrically connect them. The bonding of the connecting members 61 may be performed by any method selected from bonding with a conductive bonding material (e.g., solder or sintered metal), laser bonding, or ultrasonic bonding.

The semiconductor device A2 includes a plurality of semiconductor elements 11, a conductor layer 221, a power terminal 32, a detection terminal 34, connecting members 61, and a connecting member 42. As with the connecting members 41, the connecting members 61 electrically connect the first electrodes 111 and the conductor layer 221. According to the configuration, the connecting members 61, the conductor layer 221, and so on are disposed in the conduction path between the detection terminal 34 (source sense terminal) and the first electrodes 111 (source electrodes). As such, the semiconductor device A2 has a similar advantage to the semiconductor device A1 in that when an overcurrent flows between the second electrodes 112 and the first electrodes 111 (between drains and sources), the voltage applied between the third electrodes 113 and the first electrodes 111 (between gates and sources) can be reduced by the parasitic inductance at the connecting members 61 and the conductor layer 221. Hence, the semiconductor device A2 can improve the short-circuit tolerance of the semiconductor elements 11.

Figure 9:
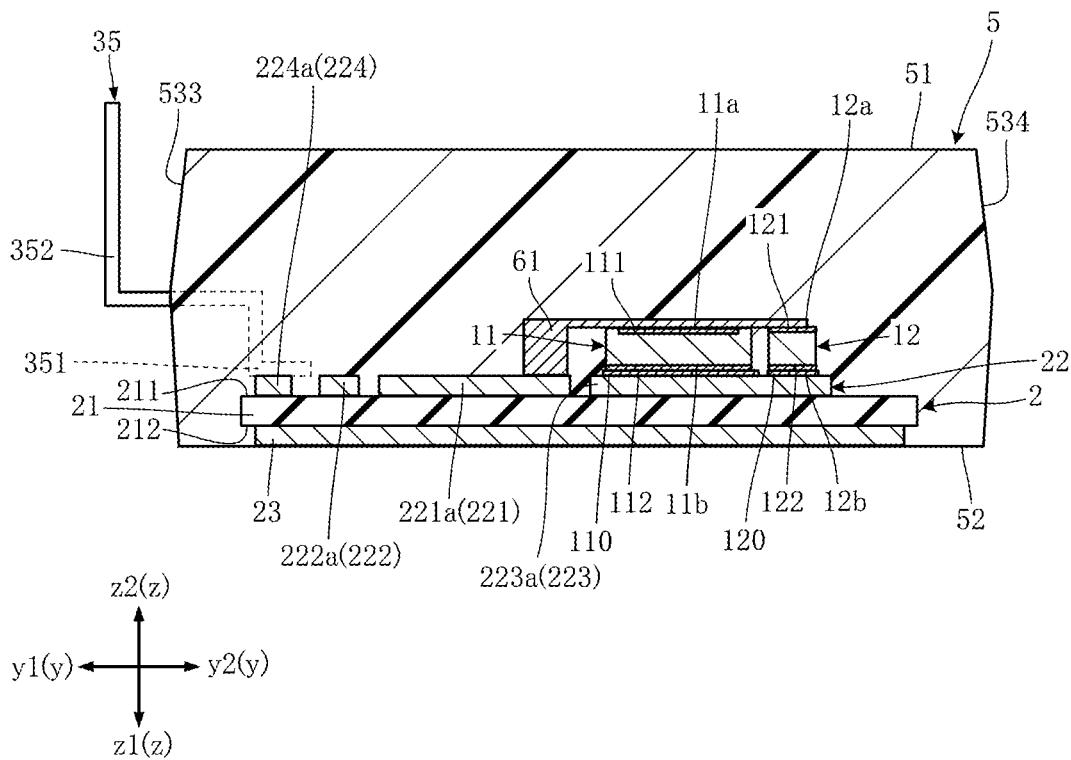
FIG. 9 is a cross-sectional view showing a semiconductor device according to a variation of the second embodiment.

In the second embodiment, a part of each connecting member 61 is bent so as to connect two portions that are offset from each other in the z direction, as shown in FIG. 8. However, the present disclosure is not limited to this. For example, the thickness (dimension in the z direction) of each of the connecting members 61 may vary at different positions so as to connect two portions that are offset from each other in the z direction, as shown in FIG. 9.

In the second embodiment, each of the connecting members 61 is bonded to the conductor layer 221, the first electrodes 111 of a different semiconductor element 11, and the anode electrode 121 of a different semiconductor element 12. However, the present disclosure is not limited to this. For example, each of the connecting members 61 may be divided into two members, i.e., a first member for electrically connecting the conductor layer 221 and the first electrode 111 of a different semiconductor element 11, and a second member for electrically connecting the first electrode 111 of the different semiconductor element 11 and the anode electrode 121 of a different semiconductor element 12. In this case, as in the semiconductor device A1, the plurality of connecting members 41 may be used instead of the first members, and the plurality of connecting members 45 may be used instead of the second members.

FIGS. 10 to 13 show a semiconductor device according to a third embodiment. A semiconductor device A3 according to the third embodiment is mainly different from the semiconductor device A1 in constituting a half-bridge switching circuit. As shown in FIGS. 10 to 13, the semiconductor device A3 includes a plurality of semiconductor elements 11, 12, 13, and 14, a supporting member 2, power terminals 31, 32, and 36, a pair of signal terminals 33 and 37, a pair of detection terminals 34 and 38, a pair of detection terminals 35 and 39, a plurality of dummy terminals 30, a plurality of connecting members 61, 62, 42, 43, 44, 46, 47, 48, 49, and 40, and a resin member 5.

Figure 10:
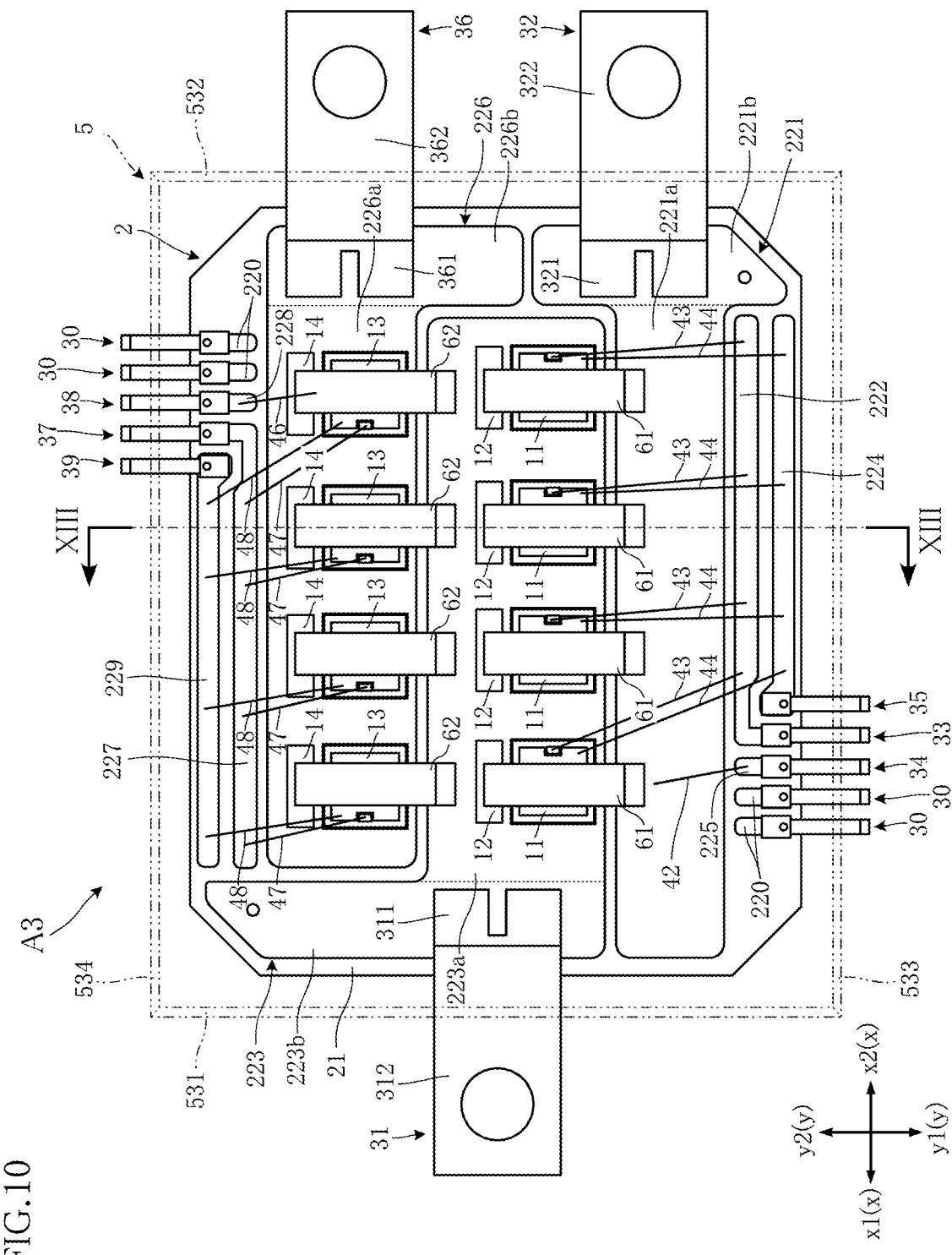
FIG. 10 is a plan view showing a semiconductor device according to a third embodiment.
Figure 11:
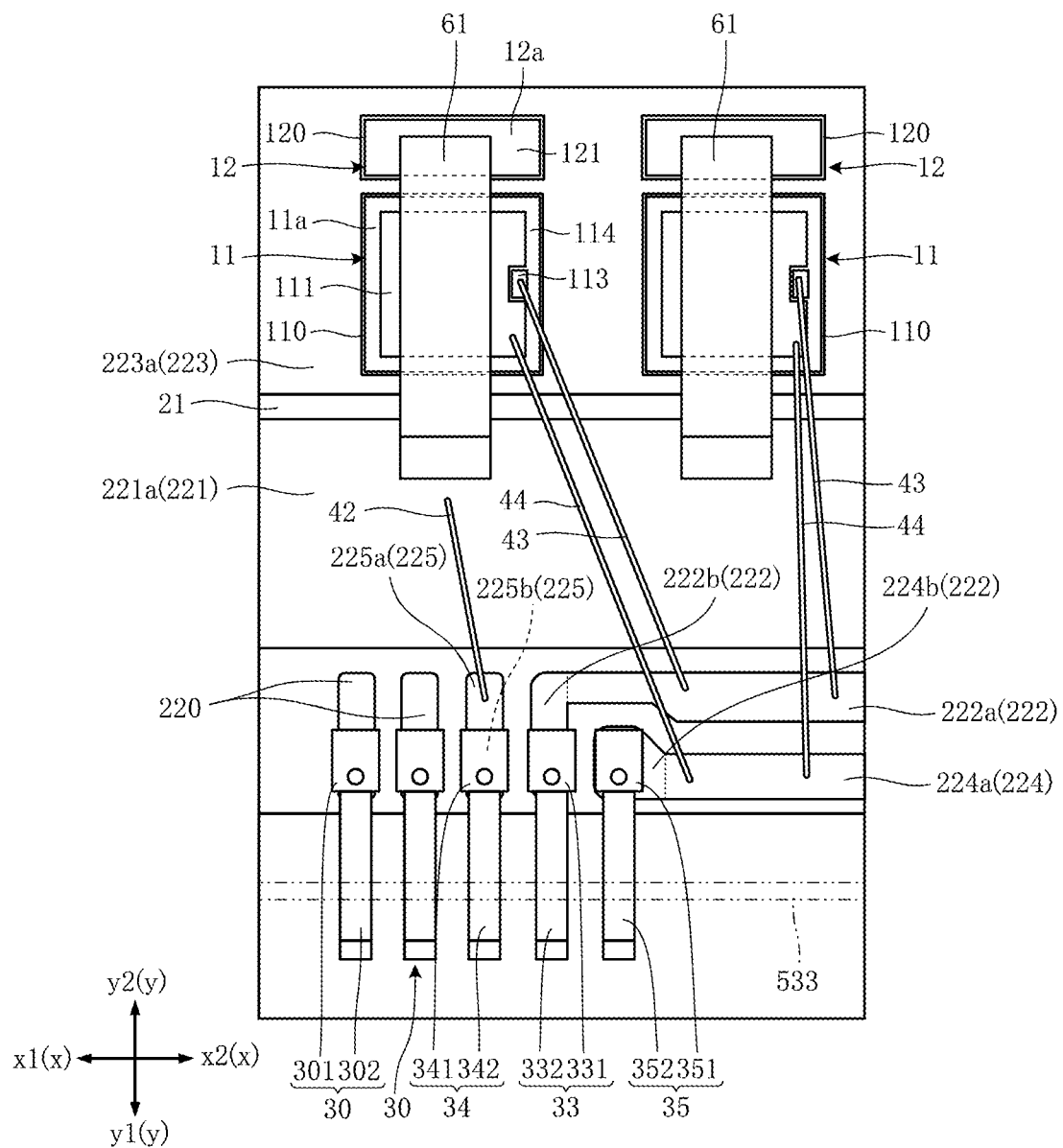
FIG. 11 is a partially enlarged view showing a part of FIG. 10.
Figure 12:
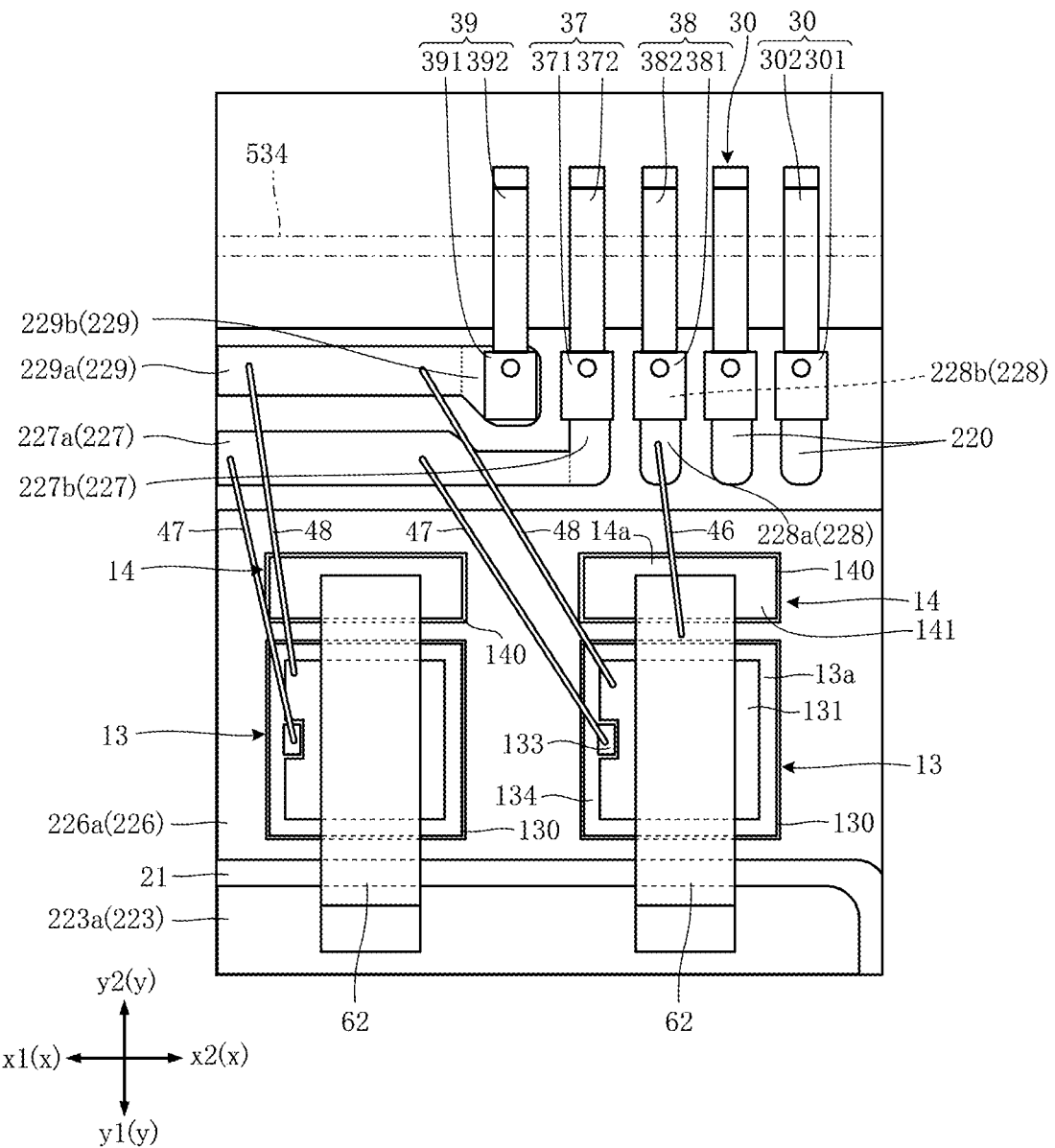
FIG. 12 is a partially enlarged view showing a part of FIG. 10.
Figure 13:
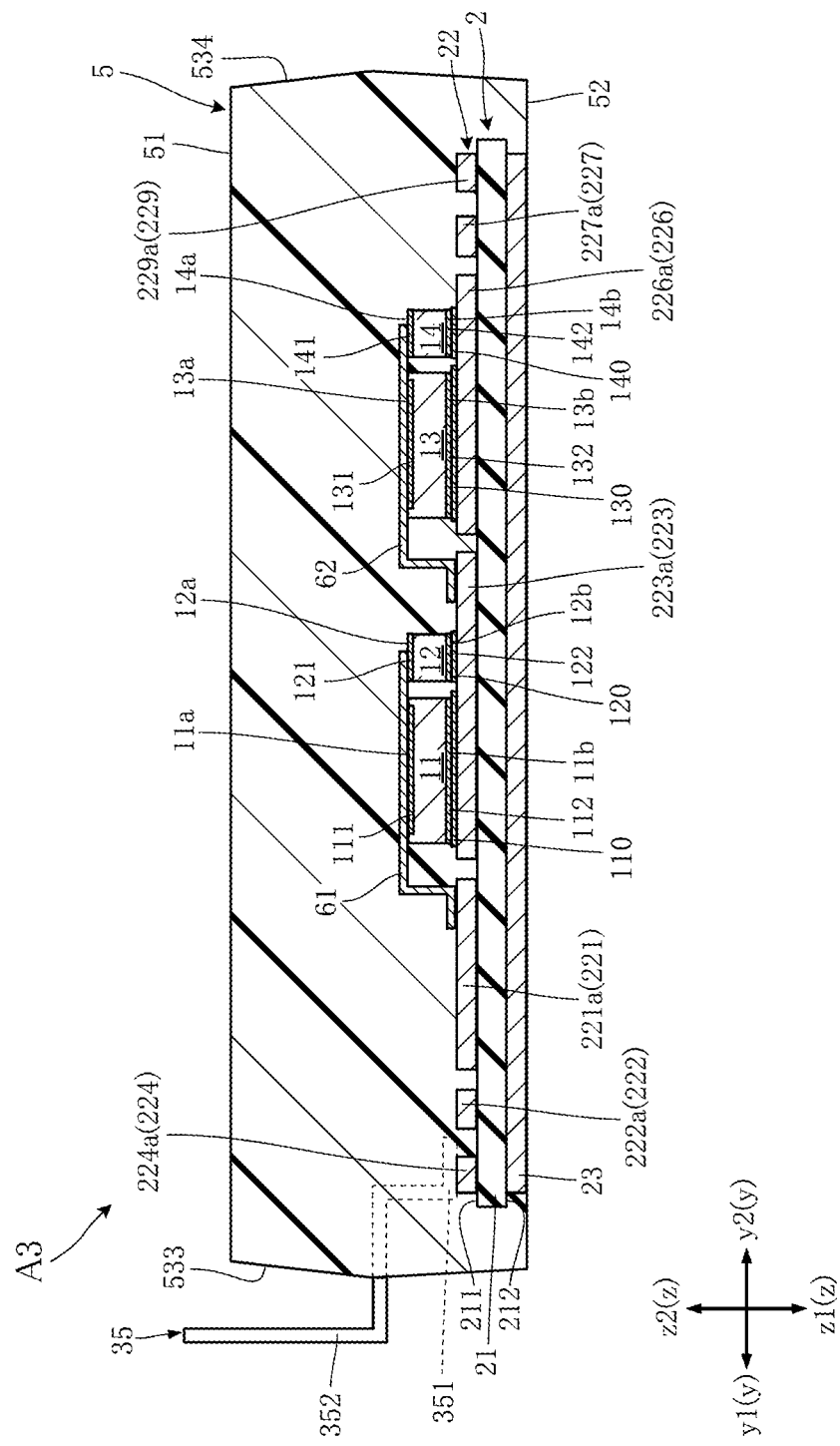
FIG. 13 is a cross-sectional view along line XIII-XIII in FIG. 10.

FIG. 10 is a plan view showing the semiconductor device A3, and shows the resin member 5 with an imaginary line. Each of FIGS. 11 and 12 is a partially enlarged view showing a part of the plan view in FIG. 10. FIG. 13 is a cross-sectional view taken along line XIII-XIII in FIG. 10.

As described above, the semiconductor device A3 includes the plurality of semiconductor elements 13 in addition to the plurality of semiconductor elements 11. The semiconductor elements 13 constitute upper arm circuits in the semiconductor device A3 (switching circuit), and the semiconductor elements 11 constitute lower arm circuits in the semiconductor device A3 (switching circuit).

The semiconductor elements 13 are similar in configuration to the semiconductor elements 11. The semiconductor elements 13 are MOSFETs, but may be transistors other than MOSFETs. The semiconductor elements 13 may be made of SiC, Si, GaAs, or GaN. Each of the semiconductor elements 13 is bonded to the supporting member 2 with a conductive bonding member 130. The conductive bonding member 130 is solder, silver paste or sintered metal, for example.

Each of the semiconductor elements 13 has an element obverse surface 13a and an element reverse surface 13b. The element obverse surface 13a and the element reverse surface 13b of each semiconductor element 13 are separated apart from each other in the z direction. The element obverse surface 13a is the upper surface of the semiconductor element 13, and faces in the z2 direction. The element reverse surface 13b is the lower surface of the semiconductor element 13, and faces in the z1 direction. The element reverse surface 13b faces the supporting member 2.

Each of the semiconductor elements 13 has a first electrode 131, a second electrode 132, a third electrode 133, and an insulating film 134. The first electrodes 131 correspond to the first electrodes 111 of the semiconductor elements 11. The second electrodes 132 correspond to the second electrodes 112 of the semiconductor elements 11. The third electrodes 133 correspond to the third electrodes 113 of the semiconductor elements 11. The insulating films 134 correspond to the insulating films 114 of the semiconductor elements 11. In each of the semiconductor elements 13, the first electrode 131 is a source electrode, the second electrode 132 is a drain electrode, and the third electrode 133 is a gate electrode.

The semiconductor elements 14 are similar in configuration to the semiconductor elements 12. The semiconductor elements 14 are diodes. The semiconductor elements 14 are connected in reverse parallel to the semiconductor elements 13. Each of the semiconductor elements 14 is bonded to the supporting member 2 with a conductive bonding member 140. The conductive bonding member 140 is solder, silver paste or sintered metal, for example.

Each of the semiconductor elements 14 has an element obverse surface 14a and an element reverse surface 14b. The element obverse surface 14a and the element reverse surface 14b of each semiconductor element 14 are separated apart from each other in the z direction. The element obverse surface 14a is the upper surface of the semiconductor element 14, and faces in the z2 direction. The element reverse surface 14b is the lower surface of the semiconductor element 14, and faces in the z1 direction. The element reverse surface 14b faces the supporting member 2.

Each of the semiconductor elements 14 has an anode electrode 141 and a cathode electrode 142. The anode electrodes 141 correspond to the anode electrodes 121 of the semiconductor elements 13, and the cathode electrodes 142 correspond to the cathode electrodes 122 of the semiconductor elements 13. The cathode electrodes 142 are electrically connected to a part of the supporting member 2 (the conductor layer 226 described below) via the conductive bonding members 140.

The obverse-surface metal layer 22 of the supporting member 2 in the semiconductor device A3 further includes a plurality of conductor layers 226, 227, 228, 229, and 220, as compared to the obverse-surface metal layer 22 in the semiconductor device A1. Accordingly, the obverse-surface metal layer 22 in the semiconductor device A3 includes a plurality of conductor layers 220 to 229. The plurality of conductor layers 220 to 229 are separated apart from each other.

The conductor layer 226 includes a band-shaped portion 226a and a terminal bonding portion 226b. The band-shaped portion 226a extends in the x direction, and the plurality of semiconductor elements 13 and 14 are bonded to the band-shaped portion 226a. The plurality of semiconductor elements 13 bonded to the band-shaped portion 226a are aligned in the direction (x direction) in which the band-shaped portion 226a extends. The terminal bonding portion 226b is where a part of the power terminal 36 (a pad portion 361 described below) is bonded. The band-shaped portion 226a and the terminal bonding portion 226b are connected to and integrally formed with each other. The conductor layer 226 is electrically connected to the second electrodes 132 (drain electrodes) of the semiconductor elements 13 via the conductive bonding members 130, and is electrically connected to the cathode electrodes 142 of the semiconductor elements 14 via the conductive bonding members 140. In other words, the second electrodes 132 of the semiconductor elements 13 and the cathode electrodes 142 of the semiconductor elements 14 are electrically connected to each other via the conductor layer 226.

As shown in FIG. 12, the conductor layer 227 includes a band-shaped portion 227a and a terminal bonding portion 227b. The band-shaped portion 227a extends in the x direction, and the plurality of connecting members 47 are bonded to the band-shaped portion 227a. The terminal bonding portion 227b is where a part of the signal terminal 37 (a pad portion 371 described below) is bonded. The band-shaped portion 227a and the terminal bonding portion 227b are connected to and integrally formed with each other.

The conductor layer 228 includes a connecting-member bonding portion 228a and a terminal bonding portion 228b. The connecting-member bonding portion 228a is where the connecting member 46 is bonded. The terminal bonding portion 228b is where a part of the detection terminal 38 (a pad portion 381 described below) is bonded. The connecting-member bonding portion 228a and the terminal bonding portion 228b are connected to and integrally formed with each other.

As shown in FIG. 12, the conductor layer 229 includes a band-shaped portion 229a and a terminal bonding portion 229b. The band-shaped portion 229a extends in the x direction, and the plurality of connecting members 48 are bonded to the band-shaped portion 229a. The terminal bonding portion 229b is where a part of the detection terminal 39 (a pad portion 391 described below) is bonded. The band-shaped portion 229a and the terminal bonding portion 229b are connected to and integrally formed with each other.

As shown in FIGS. 11 and 12, each of the conductor layers 220 is where a part of a different dummy terminal 30 (a pad portion 301 described below) is bonded. None of the connecting members 41 to 48, 61, and 62 is bonded to the conductor layers 220. Accordingly, the conductor layers 220 are not electrically connected to any of the semiconductor elements 11 to 14.

The power terminal 31 is electrically connected to the second electrodes 112 (drain electrodes) of the semiconductor elements 11, as with the power terminal 31 of the semiconductor device A1. The power terminal 31 is also electrically connected to the first electrodes 131 (source electrodes) of the semiconductor elements 13 via the conductor layer 223 and the connecting members 62, as shown in FIGS. 10 and 13.

As with the power terminal 32, the power terminal 36 is a plate-like member. The power terminal 36 is electrically connected to the second electrodes 132 (drain electrodes) of the semiconductor elements 13 via the conductor layer 226 and the conductive bonding members 130.

As shown in FIG. 10, the power terminal 36 includes a pad portion 361 and a terminal portion 362. The pad portion 361 is covered with the resin member 5. The pad portion 361 is bonded to the conductor layer 226. The bonding may be performed by any method selected from bonding with a conductive bonding material (e.g., solder or sintered metal), laser bonding, or ultrasonic bonding. The terminal portion 362 is exposed from the resin member 5. As shown in FIG. 10, the terminal portion 362 extends from the resin member 5 in the x2 direction in plan view. The surface of the terminal portion 362 may be plated with silver, for example.

The signal terminal 37 is electrically connected to the third electrodes 133 (gate electrodes) of the semiconductor elements 13 via the conductor layer 227 and the plurality of connecting members 47. A drive signal for the on/off control of each semiconductor element 13 is inputted to the signal terminal 37. The signal terminal 37 is connected to a drive circuit DR, for example, that inputs a drive signal.

As shown in FIG. 12, the signal terminal 37 includes a pad portion 371 and a terminal portion 372. The pad portion 371 is covered with the resin member 5. The pad portion 371 is bonded to the terminal bonding portion 227b of the conductor layer 227. The bonding may be performed by any method selected from bonding with a conductive bonding material (e.g., solder or sintered metal), laser bonding, or ultrasonic bonding. The terminal portion 372 is exposed from the resin member 5. The terminal portion 372 has an L shape as viewed in the x direction.

The detection terminal 38 is electrically connected to the first electrode 131 (source electrode) of one of the semiconductor elements 13 via the conductor layer 228, the connecting member 46, and the connecting member 62. As with the detection terminal 34, the detection terminal 38 is connected to a drive circuit that generates a drive signal for each of the semiconductor elements 13. The voltage applied to the detection terminal 38 is output to the drive circuit as a feedback signal.

As shown in FIG. 12, the detection terminal 38 includes a pad portion 381 and a terminal portion 382. The pad portion 381 is covered with the resin member 5. The pad portion 381 is bonded to the terminal bonding portion 228b of the conductor layer 228. The bonding may be performed by any method selected from bonding with a conductive bonding material (e.g., solder or sintered metal), laser bonding, or ultrasonic bonding. The terminal portion 382 is exposed from the resin member 5. The terminal portion 382 has an L shape as viewed in the x direction.

The detection terminal 39 is electrically connected to the first electrodes 131 (source electrodes) of the semiconductor elements 13 via the conductor layer 229 and the plurality of connecting members 48. As with the detection terminal 35, the detection terminal 39 is connected to a Miller clamp circuit. The Miller clamp circuit is connected between the detection terminal and the signal terminal 37, for example, to prevent a malfunction (false gate turn-on) of each of the semiconductor elements 13.

As shown in FIG. 12, the detection terminal 39 includes a pad portion 391 and a terminal portion 392. The pad portion 391 is covered with the resin member 5. The pad portion 391 is bonded to the terminal bonding portion 229b of the conductor layer 229. The bonding may be performed by any method selected from bonding with a conductive bonding material (e.g., solder or sintered metal), laser bonding, or ultrasonic bonding. The terminal portion 392 is exposed from the resin member 5. The terminal portion 392 has an L shape as viewed in the x direction.

The signal terminal 37, the detection terminal 38, and the detection terminal 39 protrude from a resin side surface 534 on the y2 side, which is located opposite to the resin side surface from which the signal terminal 33, the detection terminal 34, and the detection terminal 35 protrude.

The dummy terminals 30 are not electrically connected to any of the semiconductor elements 11, 12, 13, and 14.

As shown in FIGS. 11 and 12, each of the dummy terminals 30 includes a pad portion 301 and a terminal portion 302. The pad portion 301 is covered with the resin member 5. The pad portion 301 is bonded to the conductor layer 220. The bonding may be performed by any method selected from bonding with a conductive bonding material (e.g., solder or sintered metal), laser bonding, or ultrasonic bonding. The terminal portion 302 is exposed from the resin member 5. The terminal portion 302 has an L shape as viewed in the x direction.

In the semiconductor device A3, the power terminal 31 is an output terminal in the switching circuit described above. The power terminal 32 is a negative input terminal (N terminal) in the switching circuit. The power terminal 36 is a positive input terminal (P terminal) in the switching circuit. A source voltage is applied between the two power terminals 32 and 36. The semiconductor device A3 converts the voltage applied between the power terminal 32 and the power terminal 36 by the switching operation of the plurality of semiconductor elements 11 and 13, and outputs the resulting voltage from the power terminal 31.

The plurality of connecting members 62 are similar in configuration to the connecting members 61. In other words, the connecting members 62 are conductive plate-like members, and a part of each connecting member 62 is bent. As with the connecting members 61, each of the connecting members 62 may have partially different thicknesses in the z direction instead of being partially bent. Each of the connecting members 62 is bonded to the conductor layer 223, the first electrode 131 of a different semiconductor element 13, and the anode electrode 141 of a different semiconductor element 14 to electrically connect them. The bonding of the connecting members 62 may be performed by any method selected from bonding with a conductive bonding material (e.g., solder or sintered metal), laser bonding, or ultrasonic bonding.

The connecting member 46 is bonded to one of the connecting members 62 at one end (first end), and is bonded to the conductor layer 228 at the other end (second end). The connecting member electrically connects the connecting member 62 and the conductor layer 228. Preferably, the parasitic inductance from the first electrode 131 of the corresponding semiconductor element 13 to the bonding portion at which the connecting member 46 is bonded to the connecting member 62 is no less than 0.3 nH and no greater than 2 nH, for example. In other words, it is preferable that the connecting member 46 be connected to a portion of the connecting member 62 at which the parasitic inductance from the first electrode 131 is no less than 0.3 nH and no greater than 2 nH. The second end of the connecting member 46 may be bonded to the pad portion 381 of the detection terminal 38 instead of being bonded to the conductor layer 228.

Each of the connecting members 47 is bonded to the third electrode 133 (gate electrode) of a different semiconductor element 13 at one end, and is bonded to the conductor layer 227 at the other end. The connecting members 47 electrically connect the third electrodes 133 and the conductor layer 227 to each other.

Each of the connecting members 48 is bonded to the first electrode 131 (source electrode) of a different semiconductor element 13 at one end, and is bonded to the conductor layer 229 at the other end. The connecting members 48 electrically connect the first electrodes 131 and the conductor layer 229.

The semiconductor device A3 configured as described above has the following advantages.

The semiconductor device A3 includes the semiconductor elements 11, the conductor layer 221, the power terminal 32, the detection terminal 34, the connecting members 61, and the connecting member 42. According to the configuration, the connecting members 61, the conductor layer 221, and so on are disposed in the conduction path between the detection terminal 34 (source sense terminal) and the first electrodes 111 (source electrodes). As such, the semiconductor device A3 has a similar advantage to the semiconductor device A1 in that when an overcurrent flows between the second electrodes 112 and the first electrodes 111 (between drains and sources), the voltage applied between the third electrodes 113 and the first electrodes 111 (between gates and sources) can be reduced by the parasitic inductance at the connecting members 61 and the conductor layer 221. Hence, the semiconductor device A3 can improve the short-circuit tolerance of the semiconductor elements 11.

The semiconductor device A3 includes the semiconductor elements 13, the connecting members 62, the detection terminal 38, and the connecting member 46. Each of the semiconductor elements 13 includes the first electrode 113 (source electrode), the second electrode 132 (drain electrode), and the third electrode 133 (gate electrode), where the on/off control between the first electrode 131 and the second electrode 132 is performed by a drive signal inputted to the third electrode 133. The detection terminal 38 is a source sense terminal electrically connected to the first electrode 131. The connecting members 62 are bonded to the first electrodes 131 and the connecting member 46 is bonded to one of the connecting members 62. According to the configuration, the connecting member 62 is disposed in the conduction path between the detection terminal 38 (source sense terminal) and the first electrode 131 (source electrode). As such, when an overcurrent flows between the second electrodes 132 and the first electrodes 131 (between drains and sources), the voltage applied between the third electrodes 133 and the first electrodes 131 (between gates and sources) can be reduced by the parasitic inductance at the connecting members 62, as compared to the case where the detection terminal 38 and the first electrode 131 (source electrode) are directly connected to each other by a bonding wire or the like. Hence, the semiconductor device A3 can improve the short-circuit tolerance of the semiconductor elements 13. In particular, since the parasitic inductance is used, the short-circuit tolerance of the semiconductor elements 13 can be improved without the use of any inductance elements or the like.

Figure 14:
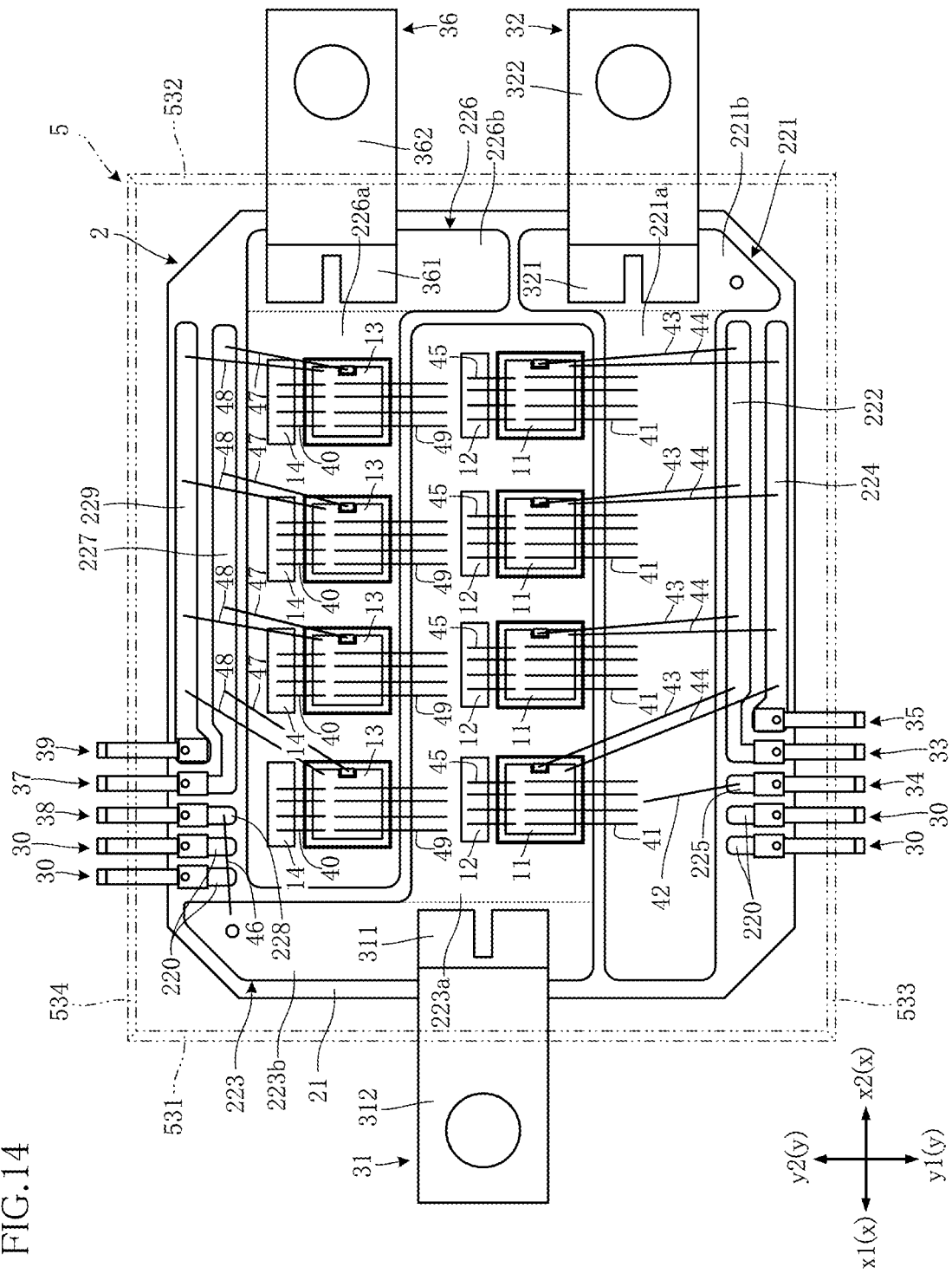
FIG. 14 is a plan view showing a semiconductor device according to a variation of the third embodiment.

Although the plate-like connecting members 61 are provided in the third embodiment, wire-like connecting members may be provided instead of the plate-like connecting members. FIG. 14 shows a semiconductor device according to such a variation. As compared to the semiconductor device A3, the semiconductor device according to the variation includes a plurality of connecting members 41 and a plurality of connecting members 45 instead of each of the connecting members 61, and includes a plurality of connecting members 49 and a plurality of connecting members 40 instead of each of the connecting members 62.

As with the connecting members 41, the connecting members 49 are bonding wires. Each set of the connecting members 49 is bonded to the first electrode 131 of a different semiconductor element 13 and the conductor layer 223. As with the connecting members 45, the connecting members 40 are bonding wires. Each set of the connecting members 40 is bonded to the first electrode 131 of a different semiconductor element 13 and the anode electrode 141 of a different semiconductor element 14 to electrically connect these electrodes.

As shown in FIG. 14, the connecting member 46 is bonded to the conductor layer 223. Furthermore, the arrangements of the signal terminal 37, the detection terminals 38 and 39, the two dummy terminals 30, the conductor layers 227, 228, and 229, and the two conductor layers 220 are changed appropriately. As with the signal terminal 33 and the detection terminals 34 and 35, the signal terminal 37 and the detection terminals 38 and 39 are shifted in the x1 direction as viewed in plan.

The semiconductor device shown in FIG. 14 also provides the same advantages as the semiconductor device A3.

Figure 15:
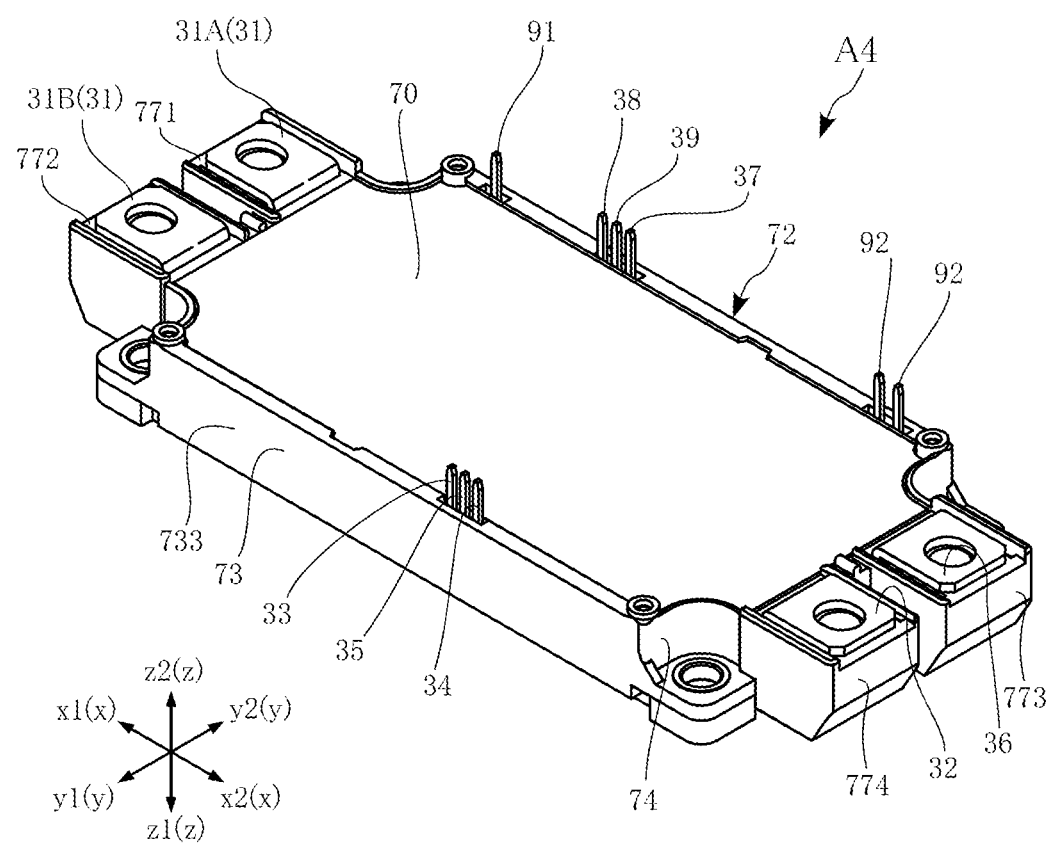
FIG. 15 is a perspective view showing a semiconductor device according to a fourth embodiment.
Figure 16:
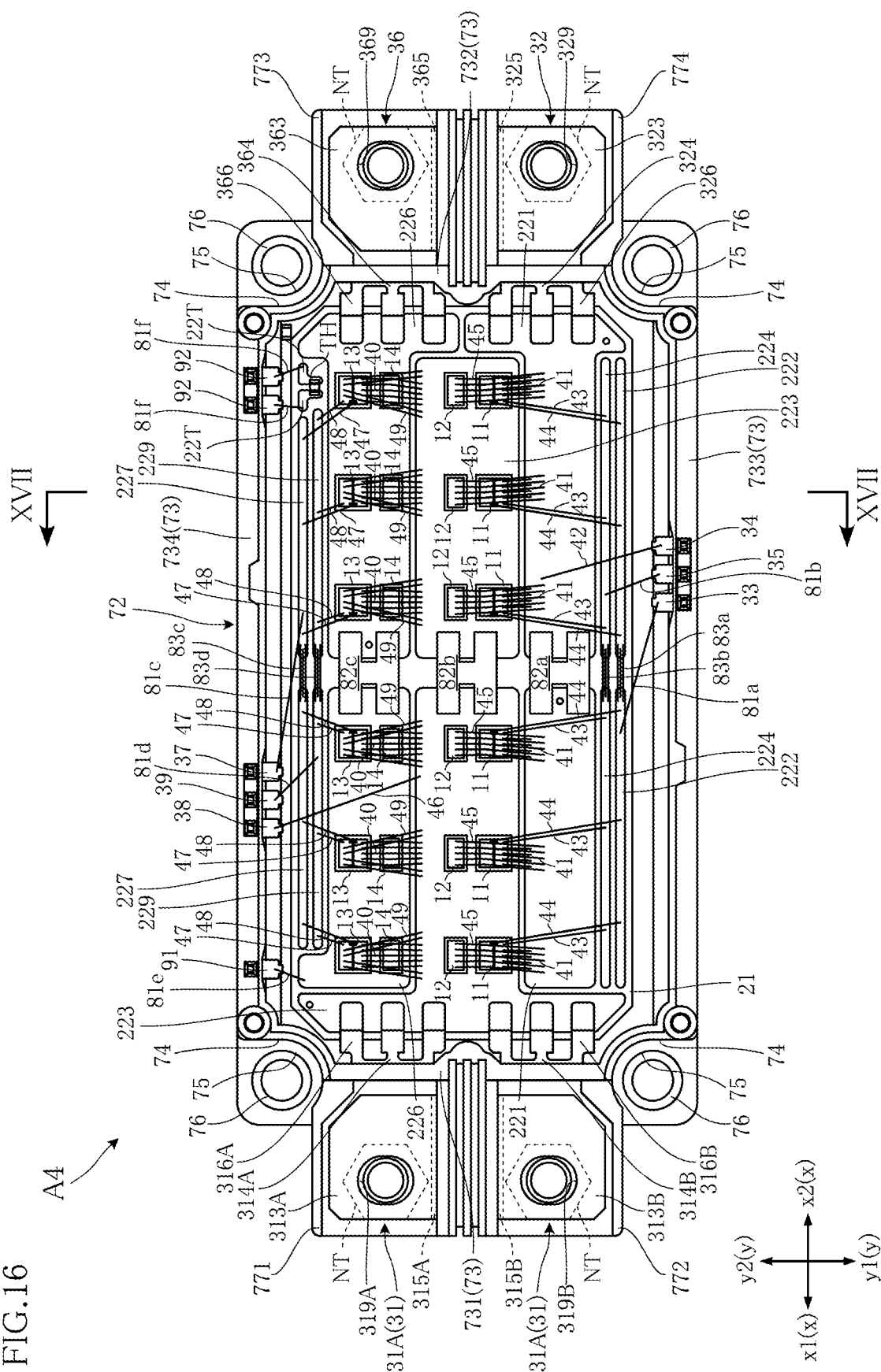
FIG. 16 is a plan view showing the semiconductor device according to the fourth embodiment.
Figure 17:
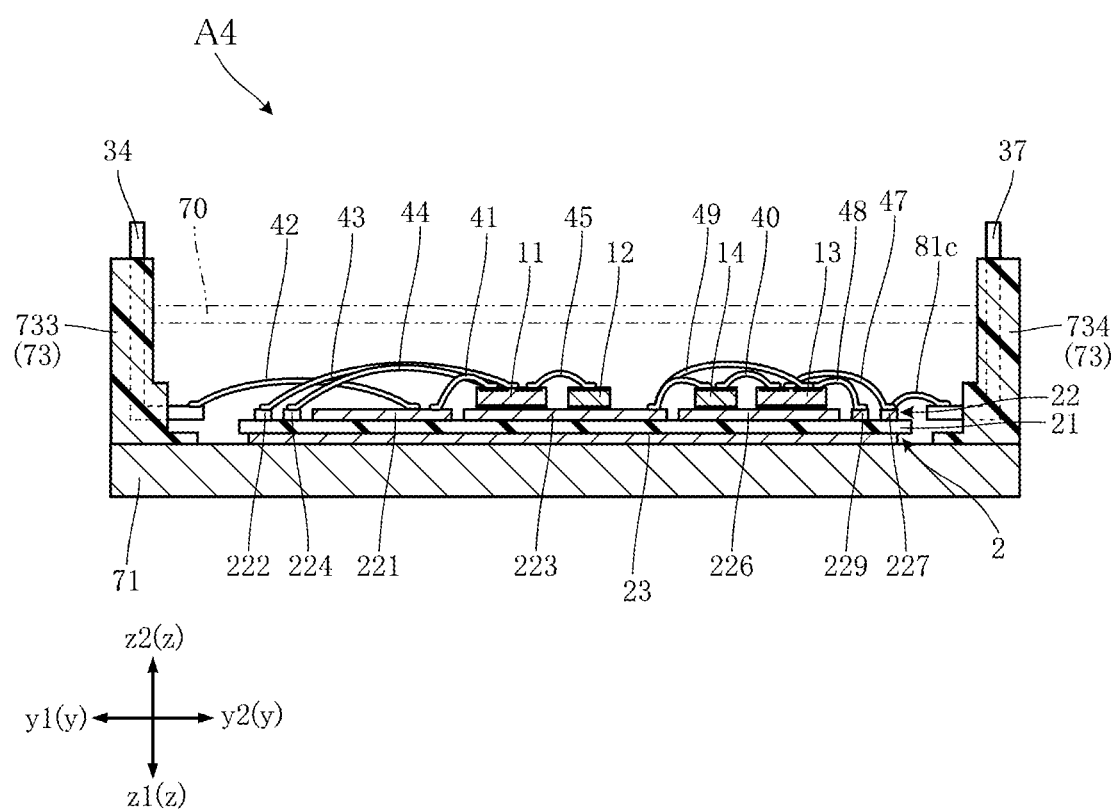
FIG. 17 is a cross-sectional view along line XVII-XVII in FIG. 16.

FIGS. 15 to 17 show a semiconductor device according to a fourth embodiment. As shown in FIGS. 15 to 17, a semiconductor device A4 according to the fourth embodiment includes a plurality of semiconductor elements 11 to 14, a supporting member 2, a plurality of power terminals 31, 32, and 36, a plurality of signal terminals 33 and 37, a plurality of detection terminals 34, 35, 38, and 39, and a plurality of connecting members 41 to 49, as with the semiconductor device A3. The semiconductor device A4 further includes a plurality of conductive members 81a to 81f, 82a to 82c, and 83a to 83d, a detection terminal 91, and two thermistor terminals 92. The semiconductor device A4 includes a heat dissipating plate 71 and a case 72, instead of the resin member 5. As shown in FIGS. 15 to 17, the semiconductor device A4 includes two power terminals 31 (31A and 31B).

FIG. 15 is a perspective view showing the semiconductor device A4. FIG. 16 is a plan view showing the semiconductor device A4 without a top plate 70 (described below). FIG. 17 is a cross-sectional view taken along line XVII-XVII in FIG. 16. Note that some constituent elements are omitted in FIG. 17.

As shown in FIG. 17, the heat dissipating plate 71 has a rectangular plate-like shape in plan view, and is made of a material having high thermal conductivity. The heat dissipating plate 71 is made of a metal such as copper. A surface of the heat dissipating plate 71 may be plated with nickel. The surface of the heat dissipating plate 71 on the z1 side may be provided with a cooling means, such as a heat sink, if necessary.

As shown in FIGS. 15 and 16, the case 72 is formed into a substantially rectangular parallelepiped shape. The case 72 is made of a synthetic resin having electric insulation and excellent heat resistance such as polyphenylene sulfide (PPS). The case 72 has a rectangular shape with substantially the same size as the heat dissipating plate 71 in plan view. The case 72 has a frame portion 73 fixed to the surface of the heat dissipating plate 71 on the z2 side, and a top plate 70 fixed to the frame portion 73. The top plate 70 closes the frame portion 73 on the z2 side, and faces the heat dissipating plate 71 that closes the frame portion 73 on the z1 side. The top plate 70, the heat dissipating plate 71, and the frame portion 73 define a circuit housing space (i.e., a space for housing the plurality of semiconductor elements 11 to 14, the supporting member 2, etc.) within the case 72.

As shown in FIG. 16, the frame portion 73 has a pair of side walls 731 and 732 separated apart from each other in the x direction, and a pair of side walls 733 and 734 separated apart from each other in the y direction. The pair of side walls 731 and 732 extend in the y direction in plan view. The side wall 731 is located on the x1 side, and the side wall 732 is located on the x2 side. The pair of side walls 733 and 734 extend in the x direction in plan view. The side wall 733 is located on the y1 side, and the side wall 734 is located on the y2 side. The side wall 733 is connected to the respective edges of the pair of side walls 731 and 732 on the y1 side, and the side wall 734 is connected to the respective edges of the pair of side walls 731 and 732 on the y2 side.

As shown in FIGS. 15 and 16, two terminal blocks 771 and 772 are formed on the outer surface of the side wall 731. The power terminal 31A is arranged on the surface of the terminal block 771 on the z2 side, and the power terminal 31B is arranged on the surface of the terminal block 772 on the z2 side. In plan view, the terminal block 771 is shifted in the y2 direction with respect to the center of the side wall 731 in the lengthwise direction thereof (y direction), and the terminal block 772 is shifted in the y1 direction with respect to the center of the side wall 731 in the lengthwise direction thereof (y direction). The terminal blocks 771 and 772 are integrally formed with the side wall 731.

As shown in FIGS. 15 and 16, two terminal blocks 773 and 774 are formed on the outer surface of the side wall 732. The power terminal 36 is arranged on the surface of the terminal block 773 on the z2 side, and the power terminal 32 is arranged on the surface of the terminal block 774 on the z2 side. In plan view, the terminal block 773 is shifted in the y2 direction with respect to the center of the side wall 732 in the lengthwise direction thereof (y direction), and the terminal block 774 is shifted in the y1 direction with respect to the center of the side wall 732 in the lengthwise direction thereof (y direction). The terminal blocks 773 and 774 are integrally formed with the side wall 732. As shown FIG. 16, a nut NT is buried in each of the terminal blocks 771 to 774 with the central axis of its screw hole coinciding with the z direction.

As shown in FIG. 16, the signal terminal 33 and the two detection terminals 34 and 35 are attached to the side wall 733. Parts of the signal terminal 33 and the two detection terminals 34 and 35 protrude from the surface of the side wall 733 on the z2 side to the outside of the case 72 (in the z2 direction). The signal terminal 33 and the two detection terminals 34 and 35 are spaced apart from each other in the x direction between the center of the side wall 733 in the lengthwise direction (x direction) and the end of the side wall 733 in the x2 direction.

As shown in FIG. 16, the signal terminal 37 and the two detection terminals 38 and 39 are attached to the side wall 734. Parts of the signal terminal 37 and the two detection terminals 38 and 39 protrude from the surface of the side wall 734 on the z2 side to the outside of the case 72 (in the z2 direction). The signal terminal 37 and the two detection terminals 38 and 39 are spaced apart from each other in the x direction between the center of the side wall 734 in the lengthwise direction (x direction) and the end of the side wall 734 in the x1 direction.

As shown in FIG. 16, a recess 74 is formed at each of four corners of the surface of the frame portion 73 on the z2 side. The bottom wall of the recess 74 is formed with a mounting through-hole 75 that passes through the bottom wall. A tubular metal member 76 is fit into and fixed to the mounting through-hole 75. The heat dissipating plate 71 is formed with mounting through-holes (not shown) that communicate with the mounting through-holes 75. The semiconductor device A4 is fixed to a mounting target at a predetermined position thereof with fasteners (e.g., bolts) that are inserted in the mounting through-holes 75 of the case 72 and the mounting through-holes of the heat dissipating plate 71. It is possible to use these mounting through-holes 75 to attach a cooling means such as the above-described heat sink.

The supporting member 2 of the semiconductor device A4 is mounted on the surface of the heat dissipating plate 71 on the z2 side as shown in FIG. 17, and is accommodated in the inside (the circuit housing space described above) of the case 72 in plan view as shown in FIG. 16.

As shown in FIG. 16, the obverse-surface metal layer 22 of the semiconductor device A4 includes two conductor layers 221, two conductor layers 222, two conductor layers 223, two conductor layers 224, two conductor layers 226, two conductor layers 227, two conductor layers 229, and two conductor layers 22T.

The two conductor layers 221 are spaced apart from each other and aligned in the x direction. The two conductor layers 221 are electrically connected to each other via the conductive member 82a. In the example shown in FIG. 16, the conductive member 82a is a metal plate-like member, but may be one (or more) bonding wire(s). The two conductor layers 221 may not be separated apart from each other, but may be formed integrally instead.

The two conductor layers 222 are spaced apart from each other and aligned in the x direction. The two conductor layers 222 are electrically connected to each other via the conductive member 83a. In the example shown in FIG. 16, the conductive member 83a is made up of a plurality of bonding wires, but may be a metal plate-like member instead. The two conductor layers 222 may not be separated apart from each other, but may be formed integrally instead.

The two conductor layers 223 are spaced apart from each other and aligned in the x direction. The two conductor layers 223 are electrically connected to each other via the conductive member 82b. In the example shown in FIG. 16, the conductive member 82b is a metal plate-like member, but may be one (or more) bonding wire(s). Three semiconductor elements 11 and three semiconductor elements 12 are bonded to each of the conductor layers 223. The two conductor layers 223 may not be separated apart from each other, but may be formed integrally instead.

The two conductor layers 224 are spaced apart from each other and aligned in the x direction. The two conductor layers 224 are electrically connected to each other via the conductive member 83b. In the example shown in FIG. 16, the conductive member 83b is made up of a plurality of bonding wires, but may be a metal plate-like member instead. The two conductor layers 224 may not be separated apart from each other, but may be formed integrally instead.

The two conductor layers 226 are spaced apart from each other and aligned in the x direction. The two conductor layers 226 are electrically connected to each other via the conductive member 82c. In the example shown in FIG. 16, the conductive member 82c is a metal plate-like member, but may be one (or more) bonding wire(s). Three semiconductor elements 13 and three semiconductor elements 14 are bonded to each of the conductor layers 226. The two conductor layers 226 may not be separated apart from each other, but may be formed integrally instead.

The two conductor layers 227 are spaced apart from each other and aligned in the x direction. The two conductor layers 227 are electrically connected to each other via the conductive member 83c. In the example shown in FIG. 16, the conductive member 83c is made up of a plurality of bonding wires, but may be a metal plate-like member instead. The two conductor layers 227 may not be separated apart from each other, but may be formed integrally instead.

The two conductor layers 229 are spaced apart from each other and aligned in the x direction. The two conductor layers 229 are electrically connected to each other via the conductive member 83d. In the example shown in FIG. 16, the conductive member 83d is made up of a plurality of bonding wires, but may be a metal plate-like member instead. The two conductor layers 229 may not be separated apart from each other, but may be formed integrally instead.

The two conductor layers 22T are spaced apart from each other and aligned in the x direction. As shown in FIG. 16, a thermistor TH is bonded to the two of the conductor layers 22T, and each of the conductor layers 22T is electrically connected to the thermistor TH.

As shown in FIG. 16, the power terminal 31A includes a tip portion 313A, a base portion 314A, and a rising portion 315A. The tip portion 313A is formed along the surface of the terminal block 771 on the z2 side. The base portion 314A is arranged in parallel with the tip portion 313A on the z1 side of the tip portion 313A. The rising portion 315A connects the edge portion of the tip portion 313A on the y1 side to the edge portion of the base portion 314A on the y1 side. Most of the base portion 314A and the rising portion 315A are buried inside the side wall 731 and the terminal block 771. The edge portion of the base portion 314A on the x2 side is formed with comb-tooth portions 316A that protrude toward the inside of the case 72. The comb-tooth portions 316A are bonded to one of the conductor layers 223.

As shown in FIG. 16, the power terminal 31B includes a tip portion 313B, a base portion 314B, and a rising portion 315B. The tip portion 313B is formed along the surface of the terminal block 772 on the z2 side. The base portion 314B is arranged in parallel with the tip portion 313B on the z1 side of the tip portion 313B. The rising portion 315B connects the edge portion of the tip portion 313B on the y2 side to the edge portion of the base portion 314B on the y2 side. Most of the base portion 314B and the rising portion 315B are buried inside the side wall 731 and the terminal block 772. The edge portion of the base portion 314B on the x2 side is formed with comb-tooth portions 316B that protrude toward the inside of the case 72. The comb-tooth portions 316B are bonded to one of the conductor layers 223.

As shown in FIG. 16, the power terminal 36 includes a tip portion 363, a base portion 364, and a rising portion 365. The tip portion 363 is formed along the surface of the terminal block 773 on the z2 side. The base portion 364 is arranged in parallel with the tip portion 363 on the z1 side of the tip portion 363. The rising portion 365 connects the edge portion of the tip portion 363 on the y1 side to the edge portion of the base portion 364 on the y1 side. Most of the base portion 364 and the rising portion 365 are buried inside the side wall 732 and the terminal block 773. The edge portion of the base portion 364 on the x1 side is formed with comb-tooth portions 366 that protrude toward the inside of the case 72. The comb-tooth portions 366 are bonded to one of the conductor layers 226.

As shown in FIG. 16, the power terminal 32 includes a tip portion 323, a base portion 324, and a rising portion 325. The tip portion 323 is formed along the surface of the terminal block 774 on the z2 side. The base portion 324 is arranged in parallel with the tip portion 323 on the z1 side of the tip portion 323. The rising portion 325 connects the edge portion of the tip portion 323 on the y2 side to the edge portion of the base portion 324 on the y2 side. Most of the base portion 324 and the rising portion 325 are buried inside the side wall 732 and the terminal block 774. The edge portion of the base portion 324 on the x1 side is formed with comb-tooth portions 326 that protrude toward the inside of the case 72. The comb-tooth portions 326 are bonded to one of the conductor layers 221.

The tip portion 363 of the power terminal 36 is formed with an insertion hole 369, the tip portion 323 of the power terminal 32 is formed with an insertion hole 329, the tip portion 313A of the power terminal 31A is formed with an insertion hole 319A, and the tip portion 313B of the power terminal 31B is formed with the insertion hole 319B. Each of the power terminals 31A, 31B, 32, and 36 can be connected to a power supply device or a load in the mounting target of the semiconductor device A4 by inserting bolts (not shown) in these insertion holes 369, 329, 319A, and 319B and fitting the bolts in the nuts NT.

The signal terminal 33 has a crank shape as viewed in the x direction. As shown in FIG. 16, the base end portion of the signal terminal 33 is arranged inside the case 72, and the tip portion of the signal terminal 33 protrudes in the z2 direction from the surface of the side wall 733 on the z2 side. The middle portion of the signal terminal 33, which connects the base end portion and the tip portion, is buried in the side wall 733. As shown in FIG. 16, the conductive member 81a is bonded to the base end portion of the signal terminal 33, and the signal terminal 33 is electrically connected to one of the two conductor layers 222 (the conductor layer 222 on the x1 side in the present embodiment) via the conductive member 81a. In the example shown in FIG. 16, the conductive member 81a is a bonding wire, but may be a metal plate-like member instead.

Each of the detection terminals 34 and 35 has a crank shape as viewed in the x direction. As shown in FIG. 16, the base end portions of the detection terminals 34 and 35 are arranged inside the case 72, and the tip portions of the detection terminals 34 and 35 protrude in the z2 direction from the surface of the side wall 733 on the z2 side. The middle portions of the detection terminals 34 and 35, which connect the base end portions and the tip portions, are buried in the side wall 733. As shown in FIG. 16, the connecting member 42 is bonded to the base end portion of the detection terminal 34, and the detection terminal 34 is electrically connected to one of the two conductor layers 221 (the conductor layer 221 on the x2 side in the present embodiment) via the connecting member 42. As shown in FIG. 16, the conductive member 81b is bonded to the base end portion of the detection terminal 35, and the detection terminal 35 is electrically connected to one of the two conductor layers 224 (the conductor layer 224 on the x2 side in the present embodiment) via the conductive member 81b. In the example shown in FIG. 16, the conductive member 81b is a bonding wire, but may be a metal plate-like member instead.

The signal terminal 37 has a crank shape as viewed in the x direction. As shown in FIG. 16, the base end portion of the signal terminal 37 is arranged inside the case 72, and the tip portion of the signal terminal 37 protrudes in the z2 direction from the surface of the side wall 734 on the z2 side. The middle portion of the signal terminal 37, which connects the base end portion and the tip portion, is buried in the side wall 734. As shown in FIG. 16, the conductive member 81c is bonded to the base end portion of the signal terminal 37, and the signal terminal 37 is electrically connected to one of the two conductor layers 227 (the conductor layer 227 on the x2 side in the present embodiment) via the conductive member 81c. In the example shown in FIG. 16, the conductive member 81c is a bonding wire, but may be a metal plate-like member instead.

Each of the detection terminals 38 and 39 has a crank shape as viewed in the x direction. As shown in FIG. 16, the base end portions of the detection terminals 38 and 39 are arranged inside the case 72, and the tip portions of the detection terminals 38 and 39 protrude in the z2 direction from the surface of the side wall 734 on the z2 side. The middle portions of the detection terminals 38 and 39, which connect the base end portions and the tip portions, are buried in the side wall 734. As shown in FIG. 16, the connecting member 46 is bonded to the base end portion of the detection terminal 38, and the detection terminal 38 is electrically connected to one of the two conductor layers 223 (the conductor layer 223 on the x1 side in the present embodiment) via the connecting member 46. As shown in FIG. 16, the conductive member 81d is bonded to the base end portion of the detection terminal 39, and the detection terminal 39 is electrically connected to one of the two conductor layers 229 (the conductor layer 229 on the x1 side in the present embodiment) via the conductive member 81d. In the example shown in FIG. 16, the conductive member 81d is a bonding wire, but may be a metal plate-like member instead.

The detection terminal 91 has a crank shape as viewed in the x direction. As shown in FIG. 16, the base end portion of the detection terminal 91 is arranged inside the case 72, and the tip portion of the detection terminal 91 protrudes in the z2 direction from the surface of the side wall 734 on the z2 side. The middle portion of the detection terminal 91, which connects the base end portion and the tip portion, is buried in the side wall 734. As shown in FIG. 16, the conductive member 81e is bonded to the base end portion of the detection terminal 91, and the detection terminal 91 is electrically connected to one of the two conductor layers 226 (the conductor layer 226 on the x1 side in the present embodiment) via the conductive member 81e. In the example shown in FIG. 16, the conductive member 81e is a bonding wire, but may be a metal plate-like member instead. Since the conductor layer 226 is electrically connected to the second electrodes 132 (drain electrodes) of the semiconductor elements 13, the detection terminal 91 is electrically connected to the second electrodes 132.

Each of the two thermistor terminals 92 has a crank shape as viewed in the x direction. As shown in FIG. 16, the base end portions of the thermistor terminals 92 are arranged inside the case 72, and the tip portions of the thermistor terminals 92 protrude in the z2 direction from the surface of the side wall 734 on the z2 side. The middle portions of the thermistor terminals 92, which connect the base end portions and the tip portions, are buried in the side wall 734. As shown in FIG. 16, the two conductive members 81f are bonded to the respective base end portions of the thermistor terminals 92, and the thermistor terminals 92 are electrically connected to the respective conductor layers 22T via the conductive members 81f. In the example shown in FIG. 16, the conductive members 81f are bonding wires, but may be metal plate-like members instead. The thermistor terminals 92 are electrically connected to the thermistor TH arranged inside the case 72 via the conductive members 81f and the conductor layers 22T. The two thermistor terminals 92 are used to detect the inner temperature of the semiconductor device A4.

The semiconductor device A4 configured as described above has the following advantages.

The semiconductor device A4 includes the semiconductor elements 11, the conductor layers 221, the detection terminal 34, the connecting members 41, and the connecting member 42. According to the configuration, the connecting members 41, the conductor layers 221, and so on are disposed in the conduction path between the detection terminal 34 (source sense terminal) and the first electrodes 111 (source electrodes). As such, the semiconductor device A4 has a similar advantage to the semiconductor device A1 in that when an overcurrent flows between the second electrodes 112 and the first electrodes 111 (between drains and sources), the voltage applied between the third electrodes 113 and the first electrodes 111 (between gates and sources) can be reduced by the parasitic inductance at the connecting members 41 and the conductor layers 221. Hence, the semiconductor device A4 can improve the short-circuit tolerance of the semiconductor elements 11.

The semiconductor device A4 includes the semiconductor elements 13, the conductor layers 223, the detection terminal 38, the connecting members 49, and the connecting member 46. According to the configuration, the connecting member 46, the conductor layers 223, and so on are disposed in the conduction path between the detection terminal 38 (source sense terminal) and the first electrodes 111 (source electrode). As such, the semiconductor device A4 has a similar advantage to the semiconductor device A3 in that when an overcurrent flows between the second electrodes 132 and the first electrodes 131 (between drains and sources), the voltage applied between the third electrodes 133 and the first electrodes 131 (between gates and sources) can be reduced by the parasitic inductance at the connecting member 46 and the conductor layers 223. Hence, the semiconductor device A4 can improve the short-circuit tolerance of the semiconductor elements 13.

Figure 18:
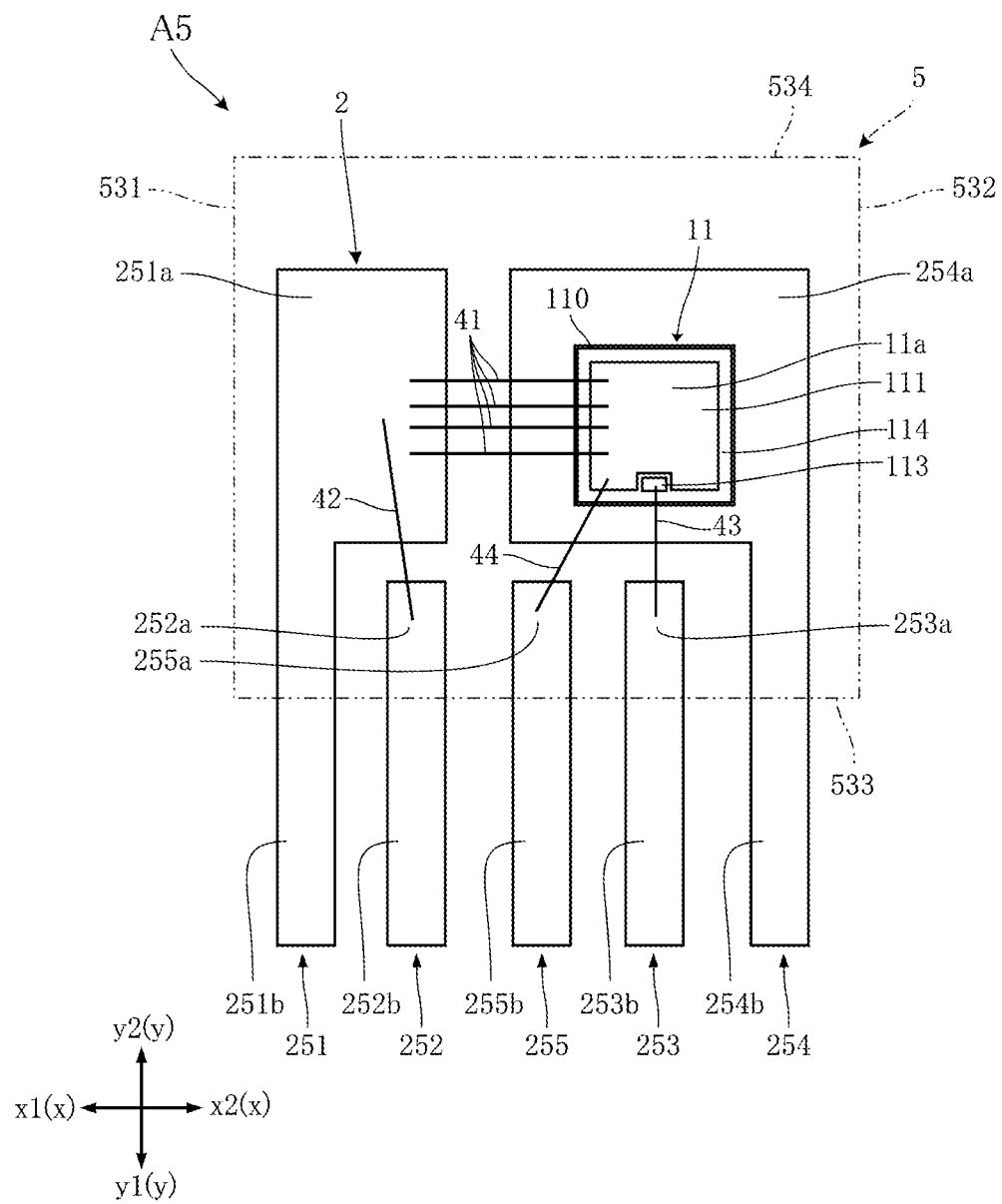
FIG. 18 is a plan view showing a semiconductor device according to a fifth embodiment.

FIG. 18 shows a semiconductor device according to a fifth embodiment. A semiconductor device A5 according to the fifth embodiment is different from the semiconductor device A1 mainly in the configuration of the supporting member 2. Specifically, the supporting member 2 of the semiconductor device A5 is a lead frame. FIG. 18 is a plan view showing the semiconductor device A5, and shows a resin member 5 with an imaginary line.

The semiconductor device A5 is of a transistor outline (TO) package type, for example. Note that the type of the semiconductor device A5 is not limited to a TO package, and may be a well-known package such as a small outline package (SOP), a small outline non-lead (SON), or a ball grid array (BGA). As shown in FIG. 18, the semiconductor device A5 includes a single semiconductor element 11.

As described above, the supporting member 2 of the semiconductor device A5 is a lead frame, and includes a plurality of leads 251 to 255 that are separated apart from each other. The plurality of leads 251 to 255, i.e., the supporting member 2, are made of a metal such as copper, for example. Parts of the leads 251 to 255 are exposed from the resin member 5. In the example shown in FIG. 18, the semiconductor device A5 is a TO package having five terminals (pins). The semiconductor device A5 may have more than five terminals (pins).

As shown FIG. 18, the lead 251 includes a pad portion 251a and a terminal portion 251b. The pad portion 251a is a part of the lead 251 that is covered with the resin member 5. A plurality of connecting members 41 are bonded to the pad portion 251a. The pad portion 251a is electrically connected to the first electrode 111 of the semiconductor element 11 via the plurality of connecting members 41. A connecting member 42 is also bonded to the pad portion 251a. The pad portion 251a is electrically connected to the lead 252 via the connecting member 42. The terminal portion 251b is a part of the lead 251 that is exposed from the resin member 5. The terminal portion 251b is connected to the pad portion 251a. Since the pad portion 251a is electrically connected to the first electrode 111, the terminal portion 251b is electrically connected to the first electrode 111. The terminal portion 251b is a source terminal in the semiconductor device A5.

As shown in FIG. 18, the lead 252 includes a pad portion 252a and a terminal portion 252b. The pad portion 252a is a part of the lead 252 that is covered with the resin member 5. The connecting member 42 is bonded to the pad portion 252a. The pad portion 252a is electrically connected to the lead 251 (pad portion 251a) via the connecting member 42. Accordingly, the pad portion 252a is electrically connected to the first electrode 111 of the semiconductor element 11 via the connecting member 42, the lead 251, and the plurality of connecting members 41. The terminal portion 252b is a part of the lead 252 that is exposed from the resin member 5. The terminal portion 252b is connected to the pad portion 252a. Since the pad portion 252a is electrically connected to the first electrode 111 of the semiconductor element 11, the terminal portion 252b is electrically connected to the first electrode 111. The terminal portion 252b is a source sense terminal in the semiconductor device A5.

As shown in FIG. 18, the lead 253 includes a pad portion 253a and a terminal portion 253b. The pad portion 253a is a part of the lead 253 that is covered with the resin member 5. The connecting member 43 is bonded to the pad portion 253a. The pad portion 253a is electrically connected to the third electrode 113 of the semiconductor element 11 via the connecting member 43. The terminal portion 253b is a part of the lead 253 that is exposed from the resin member 5. The terminal portion 253b is connected to the pad portion 253a. Since the pad portion 253a is electrically connected to the third electrode 113 of the semiconductor element 11, the terminal portion 253b is electrically connected to the third electrode 113. The terminal portion 253b is a gate terminal in the semiconductor device A5.

As shown in FIG. 18, the lead 254 includes a pad portion 254a and a terminal portion 254b. The pad portion 254a is a part of the lead 254 that is covered with the resin member 5. The semiconductor element 11 is bonded to the pad portion 254a via a conductive bonding member 110. The pad portion 254a is electrically connected to the second electrode 112 of the semiconductor element 11 via the conductive bonding member 110. The terminal portion 254b is a part of the lead 254 that is exposed from the resin member 5. The terminal portion 254b is connected to the pad portion 254a. Since the pad portion 254a is electrically connected to the second electrode 112 of the semiconductor element 11, the terminal portion 254b is electrically connected to the second electrode 112. The terminal portion 254b is a drain terminal in the semiconductor device A5.

As shown in FIG. 18, the lead 255 includes a pad portion 255a and a terminal portion 255b. The pad portion 255a is a part of the lead 255 that is covered with the resin member 5. A connecting member 44 is bonded to the pad portion 255a. The pad portion 255a is electrically connected to the first electrode 111 of the semiconductor element 11 via the connecting member 44. The terminal portion 255b is a part of the lead 255 that is exposed from the resin member 5. The terminal portion 255b is connected to the pad portion 255a. Since the pad portion 255a is electrically connected to the first electrode 111 of the semiconductor element 11, the terminal portion 255b is electrically connected to the first electrode 111. The terminal portion 255b is a source sense terminal in the semiconductor device A5.

The semiconductor device A5 includes the semiconductor element 11, the lead 251, the lead 252, the connecting members 41, and the connecting member 42. The lead 251 and the lead 252 are electrically connected to the first electrode 111. The lead 251 (terminal portion 251b) is a source terminal, and the lead 252 (terminal portion 252b) is a source sense terminal. The first electrode 111 and the pad portion 251a of the lead 251 are electrically connected to each other by the connecting members 41, and the pad portion 251a of the lead 251 and the pad portion 252a of the lead 252 are electrically connected to each other by the connecting member 42. According to the configuration, the connecting members 41, the pad portion 251a of the lead 251, and so on are disposed in the conduction path between the terminal portion 252b (source sense terminal) of the lead 252 and the first electrode 111 (source electrode). As such, the semiconductor device A5 has a similar advantage to the semiconductor device A1 in that when an overcurrent flows between the second electrode 112 and the first electrode 111 (between a drain and a source), the voltage applied between the third electrode 113 and the first electrode 111 (between a gate and a source) can be reduced by the parasitic inductance at the connecting members 41 and the pad portion 251a of the lead 251. Hence, the semiconductor device A5 can improve the short-circuit tolerance of the semiconductor element 11.

The semiconductor device A5 includes the lead 252 and the lead 255. The leads 252 and 255 are electrically connected to the first electrode 111 of the semiconductor element 11. The voltage of the first electrode 111 is applied to the lead 255. In contrast, the voltage after the voltage of the first electrode 111 is dropped due to the parasitic inductance at the connecting members 41 and the pad portion 251a of the lead 251 is applied to the lead 252. According to this configuration, the semiconductor device A5 includes two types of source sense terminals, where the lead 252 (terminal portion 252b) is configured as a source sense terminal that improves the short-circuit tolerance of the semiconductor element 11, and the lead 255 (terminal portion 255b) is configured as a source sense terminal suitable for connecting a Miller clamp circuit that suppresses a false gate turn-on, for example. Thus, the semiconductor device A5 can improve the short-circuit tolerance of the semiconductor element 11 while suppressing the false gate turn-on with the Miller clamp circuit.

The following configuration is also applicable when, in the first embodiment to the fifth embodiment, the parasitic inductance from the first electrode 111 or 131 of the semiconductor element 11 or 13 to the detection terminal 35 or 39 or to the lead 255 is no less than 0.3 nH and no greater than 2 nH. That is, each of the semiconductor devices A1 to A5 may not include the detection terminals 34, 38 or the lead 252, and may use the detection terminals 35, 39 and the lead 255 as terminals for connecting the drive circuit DR. When neither the detection terminals 34, 38 nor the lead 252 is provided, neither the conductor layers 225, 228 nor the connecting members 42, 46 may be provided as appropriate.

When, in the first to fifth embodiments, the voltage applied to the third electrodes 113 and 133 of the semiconductor elements 11 and 13 is stable (e.g., ringing is little) and thus the Miller clamp circuit MC does not need to be connected to any of the semiconductor devices A1 to A5, each of the semiconductor devices A1 to A5 does not need to include the detection terminals 35, 39, or the lead 255 (the terminals to which the Miller clamp circuit MC is connected). When neither the detection terminals 35, 39 nor the lead 255 is provided, neither the conductor layers 224, 229 nor the connecting members 44, 48 may be provided.

The semiconductor device according to the present disclosure is not limited to the above embodiments. Various design changes can be made to the specific configurations of the elements in the semiconductor device according to the present disclosure.

The semiconductor device according to the present disclosure includes embodiments relating to the following clauses.

Clause 1.

A semiconductor device comprising:
- a semiconductor element including a first electrode, a second electrode, and a third electrode, the semiconductor element being configured to perform on/off control between the first electrode and the second electrode based on a drive signal inputted to the third electrode;
- a first terminal and a second terminal that are separated apart from each other and electrically connected to the first electrode;
- a first conductor electrically connected to the first terminal;
- a first connecting member electrically connecting the first electrode and the first conductor; and
- a second connecting member electrically connecting the first conductor and the second terminal.

Clause 2.

The semiconductor device according to clause 1, further comprising:
- a third terminal that is separated apart from the first terminal and the second terminal and electrically connected to the third electrode; and
- a second conductor separated apart from the first conductor,
- wherein the third terminal is connected to a drive circuit that outputs the drive signal, and
- the third terminal and the third electrode are electrically connected to each other via the second conductor.

Clause 3.

The semiconductor device according to clause 2, further comprising a third connecting member that electrically connects the third electrode and the second conductor.

Clause 4.

The semiconductor device according to clause 2 or 3, further comprising:
- a fourth terminal that is separated apart from the first terminal, the second terminal, and the third terminal, and that is electrically connected to the second electrode; and
- a third conductor separated apart from the first conductor and the second conductor,
- wherein the fourth terminal and the second electrode are electrically connected to each other via the third conductor.

Clause 5.

The semiconductor device according to clause 4, further comprising:
- a fifth terminal that is separated apart from the first through the fourth terminals and electrically connected to the first electrode; and
- a fourth conductor separated apart from the first conductor, the second conductor, and the third conductor, wherein the fifth terminal and the first electrode are electrically connected to each other via the fourth conductor, the fifth terminal is connected to a first connecting end of a Miller clamp circuit, and the third terminal is connected to a second connecting end of the Miller clamp circuit.

Clause 6.

The semiconductor device according to clause 5, further comprising a fourth connecting member that electrically connects the first electrode and the fourth conductor.

Clause 7.

The semiconductor device according to clause 5 or 6, wherein the Miller clamp circuit includes a MOSFET, the first connecting end is a source terminal of the MOSFET, and the second connecting end is a drain terminal of the MOSFET.

Clause 8.

The semiconductor device according to any one of clauses 5 to 7, wherein the semiconductor element has an element obverse surface and an element reverse surface that are separated apart from each other in a first direction, the first electrode and the third electrode are arranged on the element obverse surface, and the second electrode is arranged on the element reverse surface.

Clause 9.

The semiconductor device according to clause 8, further comprising:

a first conductive bonding member provided between the element reverse surface and the third conductor, wherein the second electrode and the third conductor are electrically connected to each other via the first conductive bonding member.

Clause 10.

The semiconductor device according to clause 9, further comprising:

a diode including an anode electrode and a cathode electrode, wherein the anode electrode is electrically connected to the first electrode, and the cathode electrode is electrically connected to the second electrode.

Clause 11.

The semiconductor device according to clause 10, further comprising:

a fifth connecting member electrically connecting the anode electrode and the first electrode; and and a second conductive bonding member for electrically connecting the cathode electrode and the second electrode, wherein the diode is bonded to the third conductor.

Clause 12.

The semiconductor device according to any one of clauses 9 to 11, wherein the semiconductor element is a SiC-MOSFET, the first electrode is a source electrode, the second electrode is a drain electrode, and the third electrode is a gate electrode.

Clause 13.

The semiconductor device according to any one of clauses 9 to 12, wherein the first conductor includes a first band-shaped portion extending in a second direction that is perpendicular to the first direction, the second conductor includes a second band-shaped portion extending in the second direction, the third conductor includes a third band-shaped portion extending in the second direction, and the fourth conductor includes a fourth band-shaped portion extending in the second direction.

Clause 14.

The semiconductor device according to clause 13, wherein the second band-shaped portion is arranged between the first band-shaped portion and the fourth band-shaped portion in a third direction that is perpendicular to the first direction and the second direction.

Clause 15.

The semiconductor device according to clause 14, wherein the third band-shaped portion is arranged opposite to the second band-shaped portion with the first band-shaped portion interposed therebetween in the third direction, and the semiconductor element is mounted on the third band-shaped portion.

Clause 16.

The semiconductor device according to clause 15, further comprising an additional semiconductor element aligned with the semiconductor element in the second direction, wherein the additional semiconductor element is mounted on the third band-shaped portion.

Clause 17.

The semiconductor device according to any one of clauses 5 to 16, further comprising an insulation member on which the first conductor, the second conductor, the third conductor, and the fourth conductor are mounted.

Clause 18.

The semiconductor device according to any one of clauses 1 to 17, wherein a parasitic inductance from the first electrode to a bonding portion at which the first conductor and the first connecting member are bonded is no less than 0.3 nH and no greater than 2 nH.

REFERENCE SIGNS LIST

A1, A2, A3, A4, A5: Semiconductor device
11, 12, 13, 14: Semiconductor element
11a, 12a, 13a, 14a: Element obverse surface
11b, 12b, 13b, 14b: Element reverse surface
110, 120, 130, 140: Conductive bonding member
111, 131: First electrode
112, 132: Second electrode
113, 133: Third electrode
114, 134: Insulating film
121, 141: Anode electrode
122, 142: Cathode electrode
2: Supporting member
21: Insulating substrate
211: Obverse surface
212: Reverse surface
22: Obverse-surface metal layer
220-229, 22T: Conductor layer
221a, 222a, 223a, 224a, 226a, 227a, 229a: Band-shaped portion
221b, 222b, 223b, 224b, 225b, 226b, 227b, 228b, 229b: Terminal bonding portion
225a, 228a: Connecting-member bonding portion
23: Reverse-surface metal layer
251, 252, 253, 254, 255: Lead
251a, 252a, 253a, 254a, 255a: Pad portion
251b, 252b, 253b, 254b, 255b: Terminal portion 31(31A, 31B), 32, 36: Power terminal
33, 37: Signal terminal
34, 35, 38, 39: Detection terminal
30: Dummy terminal
301, 311, 321, 331, 341, 351, 361, 371, 381, 391: Pad portion
302, 312, 322, 332, 342, 352, 362, 372, 382, 392: Terminal portion
313A, 313B, 323, 363: Tip portion
314A, 314B, 324, 364: Base portion
315A, 315B, 325, 365: Rising portion
316A, 316B, 326, 366: Comb-tooth portion
319A, 319B, 329, 369: Insertion hole
41, 42, 43, 44, 45, 46, 47, 48, 61, 62: Connecting member
5: Resin member
51: Resin obverse surface
52: Resin reverse surface
531, 532, 533, 534: Resin side surface
70: Top plate
71: Heat dissipating plate
72: Case
73: Frame portion
731-734: Side wall
74: Recess
75: Mounting through-hole
76: Tubular metal member
771-774: Terminal block
81a-81f, 82a-82c, 83a-83d: Conductive member
91: Detection terminal
92: Thermistor terminal
DR: Drive circuit
MC: Miller clamp circuit
TH: Thermistor

The invention claimed is:

1. A semiconductor device comprising:
a semiconductor element including a first electrode, a second electrode, and a third electrode, the semiconductor element being configured to perform on/off control between the first electrode and the second electrode based on a drive signal inputted to the third electrode;
a first terminal and a second terminal that are separated apart from each other and electrically connected to the first electrode;
a first conductor electrically connected to the first terminal;
a first connecting member electrically connecting the first electrode and the first conductor; and
a second connecting member electrically connecting the first conductor and the second terminal.

2. The semiconductor device according to claim 1, further comprising:
a third terminal that is separated apart from the first terminal and the second terminal and electrically connected to the third electrode; and
a second conductor separated apart from the first conductor,
wherein the third terminal is connected to a drive circuit that outputs the drive signal, and
the third terminal and the third electrode are electrically connected to each other via the second conductor.

3. The semiconductor device according to claim 2, further comprising a third connecting member that electrically connects the third electrode and the second conductor.

4. The semiconductor device according to claim 2, further comprising:
a fourth terminal that is separated apart from the first terminal, the second terminal, and the third terminal, and that is electrically connected to the second electrode; and
a third conductor separated apart from the first conductor and the second conductor,
wherein the fourth terminal and the second electrode are electrically connected to each other via the third conductor.

5. The semiconductor device according to claim 4, further comprising:
a fifth terminal that is separated apart from the first through the fourth terminals and electrically connected to the first electrode; and
a fourth conductor separated apart from the first conductor, the second conductor, and the third conductor,
wherein the fifth terminal and the first electrode are electrically connected to each other via the fourth conductor,
the fifth terminal is connected to a first connecting end of a Miller clamp circuit, and
the third terminal is connected to a second connecting end of the Miller clamp circuit.

6. The semiconductor device according to claim 5, further comprising a fourth connecting member that electrically connects the first electrode and the fourth conductor.

7. The semiconductor device according to claim 5,
wherein the Miller clamp circuit includes a MOSFET,
the first connecting end is a source terminal of the MOSFET, and
the second connecting end is a drain terminal of the MOSFET.

8. The semiconductor device according to claim 5,
wherein the semiconductor element has an element obverse surface and an element reverse surface that are separated apart from each other in a first direction,
the first electrode and the third electrode are arranged on the element obverse surface, and
the second electrode is arranged on the element reverse surface.

9. The semiconductor device according to claim 8, further comprising:
a first conductive bonding member provided between the element reverse surface and the third conductor,
wherein the second electrode and the third conductor are electrically connected to each other via the first conductive bonding member.

10. The semiconductor device according to claim 9, further comprising:
a diode including an anode electrode and a cathode electrode,
wherein the anode electrode is electrically connected to the first electrode, and
the cathode electrode is electrically connected to the second electrode.

11. The semiconductor device according to claim 10, further comprising:
a fifth connecting member electrically connecting the anode electrode and the first electrode; and
and a second conductive bonding member for electrically connecting the cathode electrode and the second electrode,
wherein the diode is bonded to the third conductor.

12. The semiconductor device according to claim 9, wherein the semiconductor element is a SiC-MOSFET, the first electrode is a source electrode, the second electrode is a drain electrode, and the third electrode is a gate electrode.

13. The semiconductor device according to claim 9, wherein the first conductor includes a first band-shaped portion extending in a second direction that is perpendicular to the first direction, the second conductor includes a second band-shaped portion extending in the second direction, the third conductor includes a third band-shaped portion extending in the second direction, and the fourth conductor includes a fourth band-shaped portion extending in the second direction.

14. The semiconductor device according to claim 13, wherein the second band-shaped portion is arranged between the first band-shaped portion and the fourth band-shaped portion in a third direction that is perpendicular to the first direction and the second direction.

15. The semiconductor device according to claim 14, wherein the third band-shaped portion is arranged opposite to the second band-shaped portion with the first band-shaped portion interposed therebetween in the third direction, and the semiconductor element is mounted on the third band-shaped portion.

16. The semiconductor device according to claim 15, further comprising an additional semiconductor element aligned with the semiconductor element in the second direction, wherein the additional semiconductor element is mounted on the third band-shaped portion.

17. The semiconductor device according to claim 5, further comprising an insulation member on which the first conductor, the second conductor, the third conductor, and the fourth conductor are mounted.

18. The semiconductor device according to claim 1, wherein a parasitic inductance from the first electrode to a bonding portion at which the first conductor and the first connecting member are bonded is no less than 0.3 nH and no greater than 2 nH.

* * * * *